(12) United States Patent
Kawano et al.

(10) Patent No.: US 8,395,269 B2
(45) Date of Patent: Mar. 12, 2013

(54) METHOD OF STACKING SEMICONDUCTOR CHIPS INCLUDING FORMING AN INTERCONNECT MEMBER AND A THROUGH ELECTRODE

(75) Inventors: Masaya Kawano, Kanagawa (JP); Koji Soejima, Kanagawa (JP); Nobuaki Takahashi, Kanagawa (JP); Yoichiro Kurita, Kanagawa (JP); Masahiro Komuro, Kanagawa (JP); Satoshi Matsui, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 0 days.

(21) Appl. No.: 12/656,616

(22) Filed: Feb. 4, 2010

(65) Prior Publication Data
US 2010/0144091 A1 Jun. 10, 2010

Related U.S. Application Data

(62) Division of application No. 11/602,346, filed on Nov. 21, 2006, now abandoned.

(30) Foreign Application Priority Data

Dec. 2, 2005 (JP) .................................. 2005-349794

(51) Int. Cl.
*H01L 21/50* (2006.01)
(52) U.S. Cl. ........ 257/778; 257/685; 257/723; 257/724; 257/777; 257/82; 257/E23.021; 257/E23.011; 257/E21.597; 257/E21.503; 257/E21.511; 257/E21.499; 438/108; 438/109; 438/106; 438/107
(58) Field of Classification Search .................. 257/685, 257/723–724, 777, 778, 82, E23.021, E23.011, 257/E23.597, E21.503, E21.511, E21.499; 438/108–109, 106–107, 612–618, 622, 112–114
See application file for complete search history.

(56) References Cited

U.S. PATENT DOCUMENTS

| 6,274,937 | B1 | 8/2001 | Ahn et al. | |
| 6,610,596 | B1 * | 8/2003 | Lee et al. | 438/653 |
| 6,730,543 | B2 * | 5/2004 | Akram | 438/109 |
| 6,836,025 | B2 * | 12/2004 | Fujisawa et al. | 257/782 |
| 7,223,634 | B2 * | 5/2007 | Yamaguchi | 438/108 |

(Continued)

FOREIGN PATENT DOCUMENTS

| JP | 04-356956 | 12/1992 |
| JP | 2002-110717 (A) | 4/2002 |

(Continued)

OTHER PUBLICATIONS

Japanese Office Action dated Oct. 11, 2011 (with a partial English translation).

*Primary Examiner* — Matthew Reames
*Assistant Examiner* — Ermias Woldegeorgis
(74) *Attorney, Agent, or Firm* — McGinn IP Law Group, PLLC

(57) ABSTRACT

A method of manufacturing a semiconductor device includes forming an interconnect member, mounting a first semiconductor chip having a semiconductor substrate in a face-down manner on the interconnect member, forming a resin layer on the interconnect member to cover a side surface of the first semiconductor chip, thinning the first semiconductor chip and the resin layer, forming an inorganic insulating layer on a back surface of the first semiconductor chip so as to be in contact with the back surface and to extend over the resin layer, and forming a through electrode so as to penetrate the inorganic insulating layer and the semiconductor substrate.

25 Claims, 22 Drawing Sheets

U.S. PATENT DOCUMENTS

| | | | |
|---|---|---|---|
| 2003/0000998 A1* | 1/2003 | Yamauchi | 228/180.21 |
| 2004/0113261 A1* | 6/2004 | Sunohara et al. | 257/700 |
| 2004/0119166 A1* | 6/2004 | Sunohara | 257/758 |
| 2004/0178510 A1* | 9/2004 | Sunohara et al. | 257/781 |
| 2006/0084258 A1* | 4/2006 | Nemoto et al. | 438/611 |
| 2006/0105496 A1* | 5/2006 | Chen et al. | 438/106 |
| 2007/0007639 A1* | 1/2007 | Fukazawa | 257/686 |

FOREIGN PATENT DOCUMENTS

| | | |
|---|---|---|
| JP | 2002-343904 | 11/2002 |
| JP | 2003-151978 (A) | 5/2003 |
| JP | 2004-158537 (A) | 6/2004 |
| JP | 2004-186422 | 7/2004 |
| JP | 2005-109486 | 4/2005 |
| JP | 2005-244104 (A) | 9/2005 |
| WO | WO 2005/093827 | 10/2005 |

\* cited by examiner

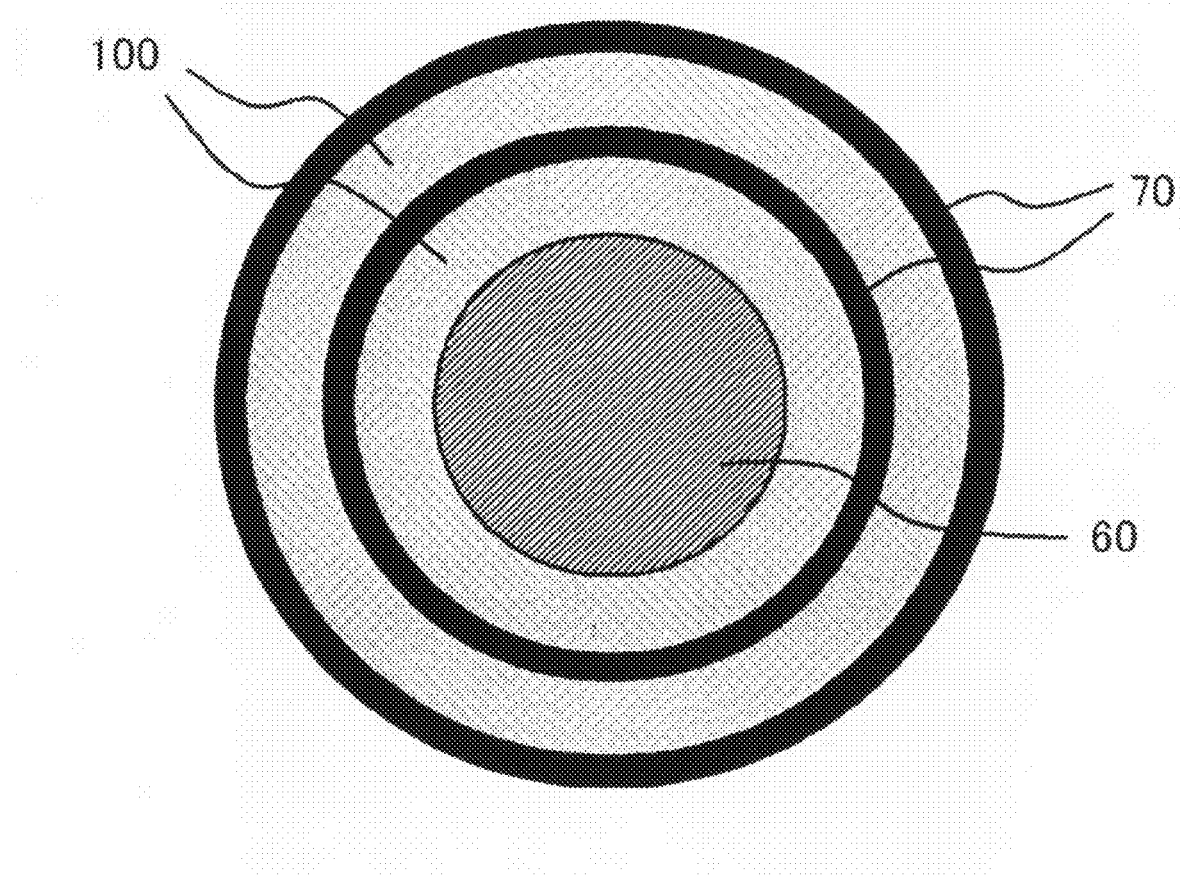

METHOD OF STACKING SEMICONDUCTOR CHIPS INCLUDING FORMING AN INTERCONNECT MEMBER AND A THROUGH ELECTRODE

The present application is a Divisional Application of U.S. patent application Ser. No. 11/602,346, filed on Nov. 21, 2006 now abandoned, which is based on Japanese patent application No. 2005-349794, incorporated herein by reference.

BACKGROUND

1. Technical Field

The present invention relates to a semiconductor device and a method of manufacturing the same.

2. Related Art

As a conventional method of manufacturing a semiconductor device, there is a method disclosed in Japanese Laid-Open patent publication No. 2002-343904 (patent document 1), for example. This document discloses a method of manufacturing a multiple-chip type semiconductor device in which a plurality of semiconductor chips are stacked.

According to the manufacturing method disclosed in the patent document 1, first, a printed substrate is prepared in which an electrode post is formed on one surface, and a connection electrode is formed on the other surface. Next, a semiconductor chip is mounted in a face-down manner on the surface of the printed substrate on which the electrode post is formed. Subsequently, after the electrode post and the semiconductor chip are subjected to resin molding, the resin-molded surface side is ground until the electrode post is exposed.

A plurality of the printed substrates obtained in this manner and having semiconductor chips mounted thereon are prepared and stacked onto one another to produce a multiple-chip type semiconductor device. At this time, connection between adjacent printed substrates is established by connection of an electrode post of one substrate to the connection electrode of the other.

According to Japanese Laid-Open patent publication No. 2005-109486 (patent document 2), first, after a contact elevation is formed on a substrate, a re-interconnect is formed on the substrate and on the contact elevation. Next, a semiconductor chip is mounted in a flip-chip manner on the substrate. Subsequently, the contact elevation and the semiconductor chip are sealed with resin. At this time, the sealing with resin is carried out so that the tip end of the contact elevation on which the re-interconnect has been formed will be exposed to the surface of the sealing resin. By repeating the steps from formation of the contact elevation to sealing with resin, a multiple-chip type semiconductor device is produced.

According to the manufacturing method disclosed in Japanese Laid-Open patent publication No. 2004-186422 (patent document 3), first, after an interconnect pattern is formed on an interconnect substrate, a connection terminal of a semiconductor chip is connected in a flip-chip manner to the interconnect pattern. Next, an insulating interlayer is formed so as to cover the entirety of the side surface and the back surface of the semiconductor chip. Subsequently, a via hole is formed that penetrates the insulating interlayer to reach the element-forming surface of the semiconductor chip. Thereafter, a metal plug is formed so as to fill the via hole.

By repeating the steps from formation of the interconnect pattern to formation of the metal plug, a multiple-chip type semiconductor device is produced. Here, via the above-described metal plug, the connection terminal of the semiconductor chip and the interconnect pattern above the semiconductor chip are electrically connected with each other.

According to the manufacturing method disclosed in Japanese Laid-Open patent publication No. H4-356956 (patent document 4), first, a semiconductor substrate in which a through hole has been formed is prepared. Next, an insulating layer and an adhesive metal layer are sequentially stacked on the wall surface of the through hole. Subsequently, a metal plug is formed so as to fill the through hole. At this time, the metal plug is formed so as to protrude from the through hole.

A plurality of semiconductor chips obtained in this manner are prepared and stacked on one another to produce a multiple-chip type semiconductor device. At this time, connection between adjacent semiconductor chips is established via the above-described protruding metal plug.

SUMMARY OF THE INVENTION

However, according to the manufacturing methods disclosed in the patent documents 1, 2, it is difficult to obtain a semiconductor device suitable for high-speed operation. The reason lies in that the interconnect that constitutes a path of signals transmitted between the semiconductor chips is once drawn out to the outside of the chips and then drawn into the inside of the chips again, thereby necessitating a larger interconnect length.

When the interconnect length is large, there will be a delay in the signals, so that it is difficult to apply this manufacturing method to a semiconductor device that requires a high-speed operation. For example, when considering the connection to a DDR2 (Double Data Rate 2) memory, even an interconnect length of about 2 to 3 mm could be a problem.

Moreover, the manufacturing methods disclosed in the patent documents 1-4 are all unsuitable for manufacturing a semiconductor device on which a thin type semiconductor chip is mounted. The reason lies in that, with regard to the patent document 1, since the back surface of the semiconductor chip is stripped bare, a problem of metal contamination will occur when the thickness of the chip is reduced. Such metal contamination will give adverse effects on the semiconductor device.

On the other hand, with regard to the patent documents 2-4, the above reason lies in that a handling step must be carried out before mounting a thinned chip on a substrate. When the chip is extremely thin (for example, less than 50 μm), the chip will be damaged even with a little force, so that it is difficult to handle a single chip. Also, due to the stress between the silicon and the insulating layer, the chip will be greatly warped when a free surface is given to the chip, thereby making the handling all the more difficult.

According to the present invention, there is provided a method of manufacturing a semiconductor device, including: forming an interconnect member; mounting a first semiconductor chip having a semiconductor substrate in a face-down manner on the interconnect member; forming a resin layer on the interconnect member so as to cover a side surface of the first semiconductor chip; thinning the first semiconductor chip and the resin layer; forming an inorganic insulating layer on a back surface of the first semiconductor chip so as to be in contact with the back surface and to extend over the resin layer; and forming a through electrode so as to penetrate the inorganic insulating layer and the semiconductor substrate.

In this manufacturing method, electrical connection between the first semiconductor chip and another semiconductor chip is established by the through electrode. This reduces the path length of the signals transmitted between the two chips as compared with the case in which the electrical connection between these two chips is established by an interconnect that detours through the outside of the chips. For this reason, a semiconductor device suitable for high-speed operation can be obtained.

Further, an inorganic insulating layer is formed that directly covers the back surface of the first semiconductor chip. This inorganic insulating layer prevents the device region (the region where semiconductor elements such as transistors are to be formed) of the semiconductor chip from being contaminated with metals. For this reason, the problem of metal contamination can be prevented from occurring even if the semiconductor chip is thinned, unlike the case in which the back surface of the semiconductor chip is stripped bare.

Also, the first semiconductor chip is thinned after being mounted on the interconnect member. For this reason, there is no need to handle the thinned semiconductor chip as a single piece. Therefore, the chip can be thinned to such a thickness that the handling as a single piece would be difficult. In view of these points, this manufacturing method is suitable for manufacturing a semiconductor device on which a thin type semiconductor chip is mounted.

According to the present invention, there is provided a semiconductor device including: an interconnect member; a first semiconductor chip mounted in a face-down manner on the interconnect member and having a semiconductor substrate; a resin layer provided on the interconnect member so as to cover a side surface of the first semiconductor chip; an inorganic insulating layer provided on a back surface of the first semiconductor chip so as to be in contact with the back surface and to extend over the resin layer; and a through electrode penetrating the first semiconductor chip and the semiconductor substrate.

In this semiconductor device, electrical connection between the first semiconductor chip and another semiconductor chip is established by the through electrode. This reduces the path length of the signals transmitted between the two chips as compared with the case in which the electrical connection between these two chips is established by an interconnect that detours through the outside of the chips. For this reason, a semiconductor device suitable for high-speed operation can be realized.

Further, an inorganic insulating layer is provided that directly covers the back surface of the first semiconductor chip. This inorganic insulating layer prevents the device region of the semiconductor chip from being contaminated with metals. For this reason, the problem of metal contamination can be prevented from occurring even if the semiconductor chip is thinned, unlike the case in which the back surface of the semiconductor chip is stripped bare.

Also, the side surface of the first semiconductor chip is covered with the resin layer, and the back surface of the first semiconductor chip is covered with the inorganic insulating layer. With such a structure, a manufacturing technique of thinning the first semiconductor chip after mounting the first semiconductor chip on the interconnect member can be suitably applied. For this reason, in manufacturing this semiconductor device, there is no need to handle the thinned semiconductor chip as a single piece. Therefore, the chip can be thinned to such a thickness that the handling as a single piece would be difficult. In view of these points, this semiconductor device is suitable for mounting a thin type semiconductor chip.

Thus, according to the present invention, a semiconductor device suitable for high-speed operation and thickness reduction and a method of manufacturing the same are provided.

BRIEF DESCRIPTION OF THE DRAWINGS

The above and other objects, advantages and features of the present invention will be more apparent from the following description taken in conjunction with the accompanying drawings, in which:

FIG. 12 is a plan view illustrating a modified example of a construction of an insulating ring;

DETAILED DESCRIPTION

Figure 1:
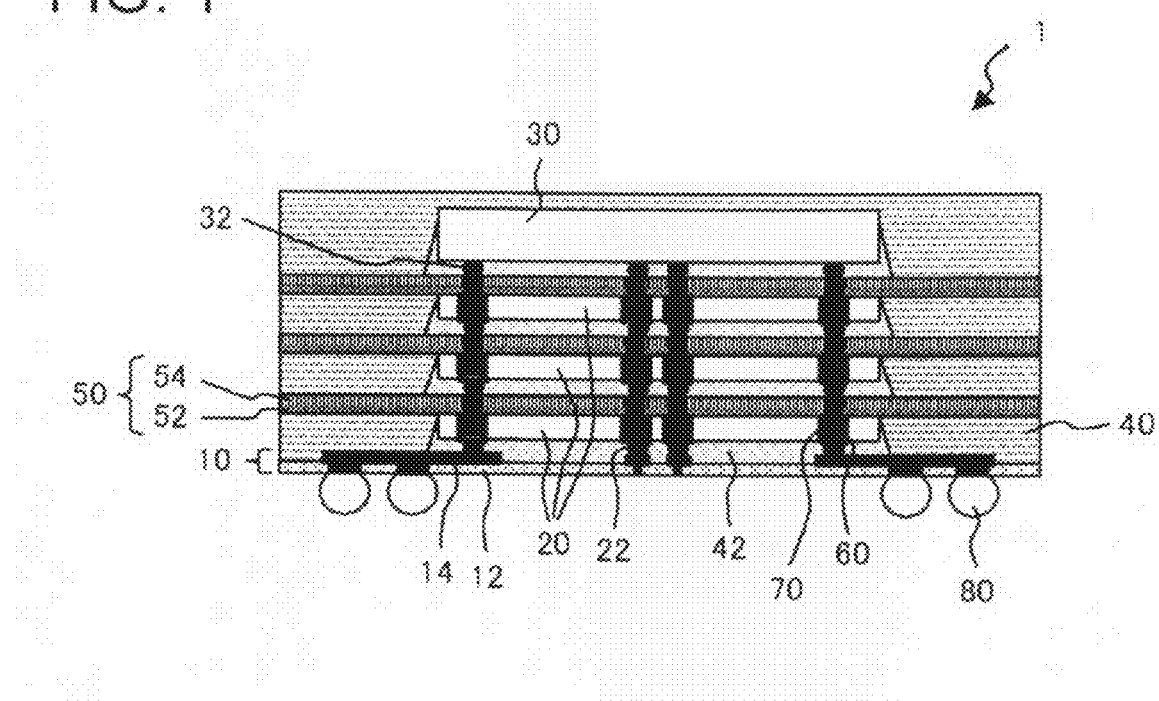
FIG. 1 is a cross-sectional view illustrating an embodiment of a semiconductor device according to the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereafter, preferable embodiments of a semiconductor device and a method of manufacturing the same according to the present invention will be described in detail with reference to the attached drawings. Here, in the description of the drawings, the same elements will be denoted with the same reference numerals, and the description thereof will not be repeated.

FIG. 1 is a cross-sectional view illustrating an embodiment of a semiconductor device according to the present invention. The semiconductor device 1 includes an interconnect member 10, a semiconductor chip 20 (first semiconductor chip), a semiconductor chip 30 (second semiconductor chip), a resin layer 40, an inorganic insulating layer 50, and a through electrode 60. The interconnect member 10 includes an insulating resin 12 and an interconnect 14 formed thereon. An electroconductive material is formed in an opening formed in the insulating resin 12. Via this electroconductive material, electrical connection between the interconnect 14 and a solder bump 80 described later is established.

The semiconductor chip 20 is mounted in a face-down manner on the interconnect member 10. Specifically, the semiconductor chip 20 has a connection terminal 22, and this connection terminal 22 is connected in a flip-chip manner to the interconnect 14.

Also, the resin layer 40 is formed on the interconnect member 10. This resin layer 40 covers the side surface of the semiconductor chip 20. The resin constituting the resin layer 40 is, for example, an epoxy resin or a BT (Bismaleimide-Triazine) resin. Approximately the whole of the side surface of the semiconductor chip 20 is covered with the resin layer 40, and the back surface of the semiconductor chip 20 (the surface opposite to the connection terminal 22) is exposed to the surface of the resin layer 40.

The gap between the interconnect member 10 and the semiconductor chip 20 is filled with an underfill resin 42. This underfill resin 42 covers the upper surface of the semiconductor chip 20 (the surface on which the connection terminal 22 is formed). Here, the underfill resin 42 may be disposed so as to cover the side surface of the semiconductor chip 20 in addition to the upper surface of the semiconductor chip 20. In this case, the above-described resin layer 40 covers the side surface of the semiconductor chip 20 via the underfill resin 42.

The inorganic insulating layer 50 is formed on the back surface of the semiconductor chip 20. This inorganic insulating layer 50 is in contact with the back surface of the semiconductor chip 20, and directly covers the back surface. Also, the inorganic insulating layer 50 extends over the resin layer 40. In the present embodiment in particular, the inorganic insulating layer 50 is disposed to extend over the whole surface of the resin layer 40. Further, the inorganic insulating layer 50 is made of a plurality of inorganic insulating films that are stacked on one another. In the present embodiment, the inorganic insulating layer 50 is made of a SiN film 52 and a $SiO_2$ film 54 formed thereon.

Also, the through electrode 60 is formed in the semiconductor chip 20. This through electrode 60 penetrates the inorganic insulating layer 50 and the semiconductor substrate of the semiconductor chip 20. The semiconductor substrate that the semiconductor chip 20 has is, for example, a silicon substrate. In this semiconductor substrate, an insulating ring 70 that surrounds the through electrode 60 is formed. The detailed construction of the insulating ring 70 will be described later.

In the semiconductor device 1, a plurality (specifically, three in FIG. 1) of the semiconductor chips 20 having such a construction are provided, and these are stacked one on another. The semiconductor chip 30 is provided on the semiconductor chip 20 located in the uppermost layer among these semiconductor chips 20. Namely, the semiconductor chip 30 is mounted in a face-down manner on the inorganic insulating layer 50 that covers the back surface of the semiconductor chip 20 located in the uppermost layer. Specifically, the semiconductor chip 30 has a connection terminal 32, and this connection terminal 32 is connected in a flip-chip manner to the through electrode 60 that penetrates the inorganic insulating layer 50. This establishes electrical connection between the semiconductor chip 30 and the through electrode 60. This semiconductor chip 30 is the chip located in the uppermost layer in the whole semiconductor device 1.

Further, a solder bump 80 (external electrode terminal) is formed on the bottom surface of the interconnect member 10 (the surface opposite to the semiconductor chip 20).

With reference to FIGS. 2A to 4C, one example of a method of manufacturing the semiconductor device 1 will be described as an embodiment of the method of manufacturing a semiconductor device according to the present invention. In summary, this manufacturing method includes the following steps (a) to (g):

(a) forming an interconnect member 10;

(b) mounting a semiconductor chip 20 having a semiconductor substrate in a face-down manner on the interconnect member 10;

(c) forming a resin layer 40 on the interconnect member 10 so as to cover a side surface of the semiconductor chip 20;

(d) thinning the semiconductor chip 20 and the resin layer 40;

(e) forming an inorganic insulating layer 50 on a back surface of the semiconductor chip 20 so as to be in contact with the back surface and to extend over the resin layer 40;

(f) forming a through electrode 60 so as to penetrate the inorganic insulating layer 50 and the semiconductor substrate; and (g) mounting a semiconductor chip 30 in a face-down manner on the inorganic insulating layer 50 so as to be electrically connected to the through electrode 60.

Figure 2A:
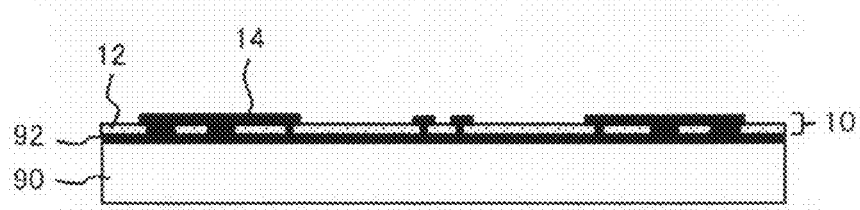
FIGS. 2A to 2C are views of steps showing an embodiment of a method of manufacturing a semiconductor device according to the present invention.

Hereafter, this manufacturing method will be described in more detail. First, a seed metal layer 92 is formed on a supporting substrate 90 such as a silicon substrate. Thereafter, an interconnect 14 is formed with use of a plating method or the like, so as to obtain an interconnect member (FIG. 2A).

Figure 2B:
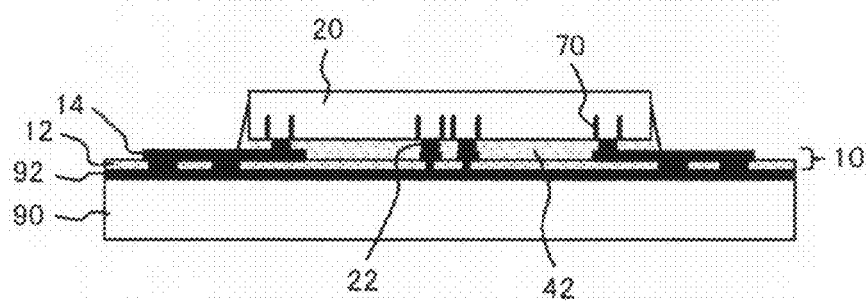
Figure 2C:
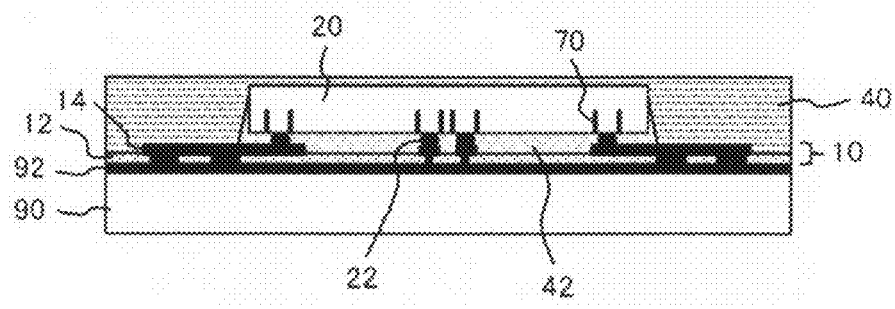

Next, on the interconnect member 10, device chips (semiconductor chips 20) that have been separated into individual pieces are mounted in a flip-chip manner. Further, the connection part of these, namely the gap between the interconnect member 10 and the semiconductor chips 20, is filled with an underfill resin 42 (FIG. 2B). At this time, a resin may be formed in advance by application, potting, or the like, and the resin may be cured simultaneously with the flip-chip connection. Subsequently, a resin layer 40 is formed on the interconnect member 10 so as to cover a side surface of the semiconductor chip 20 (FIG. 2C). At this time, the resin layer 40 may be formed so as to cover the back surface of the semiconductor chip 20 in addition to the side surface of the semiconductor chip 20.

Figure 3A:
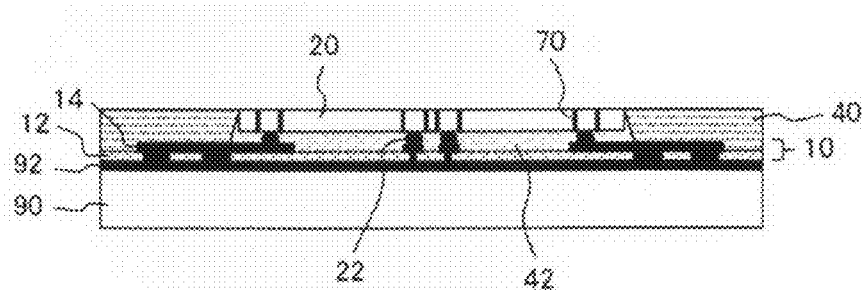
FIGS. 3A to 3C are views of steps showing an embodiment of a method of manufacturing a semiconductor device according to the present invention.
Figure 3B:
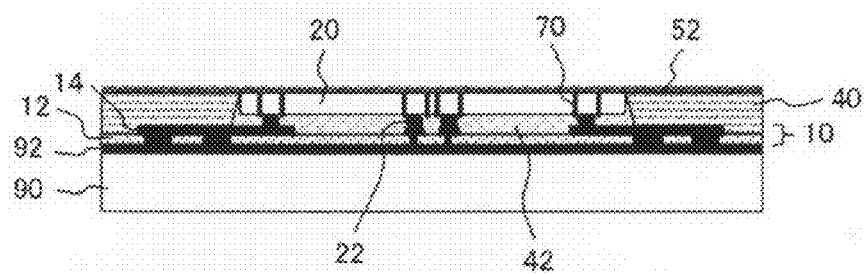

Thereafter, the semiconductor chip 20 and the resin layer 40 are simultaneously ground. By this step, the semiconductor chip 20 and the resin layer 40 are thinned (FIG. 3A). At this time, the grinding is carried out until the insulating ring 70 is exposed to the back surface of the semiconductor chip 20. The thickness of the semiconductor chip 20 after grinding may be, for example, about 20 μm. Here, in order to erase the scratch that has been generated on the back surface of the semiconductor chip 20 by grinding, a stress-relief process such as polishing, CMP (chemical mechanical polishing), or dry etching may be carried out after grinding. Next, the SiN film 52, or the SiN film 52 and the SiO₂ film 54 is formed on the back surface of the semiconductor chip 20 (FIG. 3B).

Figure 3C:
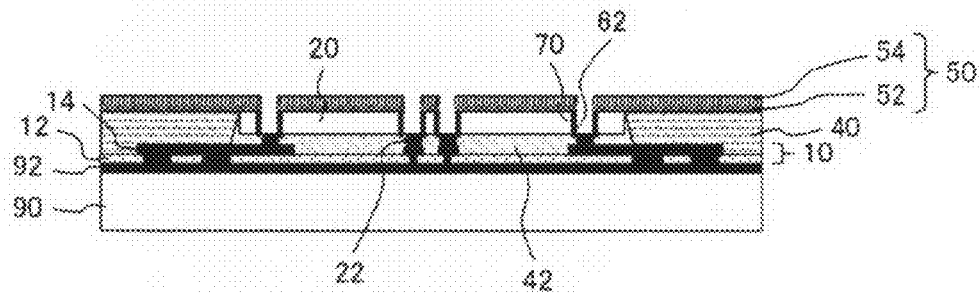

Thereafter, a region where the through electrode 60 will be formed is opened by a photolithography method or the like. Further, a through hole 62 that penetrates the inorganic insulating layer 50 and the semiconductor substrate of the semiconductor chip 20 is formed by dry etching or the like (FIG. 3C). At this time, part of the semiconductor substrate may be left between the insulating ring 70 and the through hole 62.

Further, an insulating film (hereafter referred to as a side wall insulating film) may be formed on the side surface of the through hole 62. As the side wall insulating film, for example, a monolayer film of SiO₂ or a laminate film of SiO₂/SiN may be used. In the case of forming the side wall insulating film, the insulating film is formed so that the film thickness on the bottom surface of the through hole 62 will be small, and the whole surface is etched back after forming the film, so as to remove the insulating film on the bottom surface completely. At this time, the etching-back is carried out so that the insulating film other than on the bottom surface will be left.

Figure 4A:
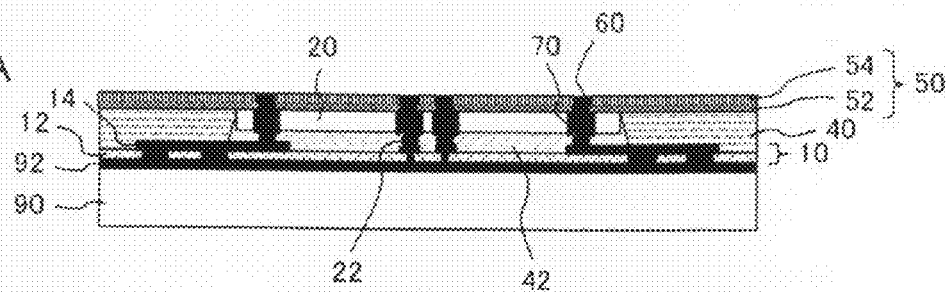
FIGS. 4A to 4C are views of steps showing an embodiment of a method of manufacturing a semiconductor device according to the present invention.

Next, the through hole 62 is filled with a metal. This step may be carried out, for example, in the following manner. Namely, a seed metal is formed in the inside of the through hole 62 and on the inorganic insulating layer 50 by the sputtering method or the CVD method, followed by carrying out electrolytic plating. The metal formed on the inorganic insulating layer 50 by the electrolytic plating is removed by CMP. This forms the through electrode 60 (FIG. 4A). Here, a laminate film of Cu/Ti may be raised as an example of the seed metal. Thereafter, an Au film or a laminate film of Au/Ni may be formed by electroless plating method or the like on the through electrode 60 that is exposed to the surface of the inorganic insulating layer 50. This improves the wettability of the through electrode 60 to a solder.

Here, the step of filling the through hole 62 with a metal may be carried out in the following manner. Namely, a seed metal is formed in the inside of the through hole 62 and on the inorganic insulating layer 50 by the sputtering method, and the seed metal formed other than on the bottom surface of the through hole 62 is removed, followed by carrying out electroless plating.

In the case of carrying out the filling of the through hole 62 with a metal itself by electroless plating, application of a resist, tilted exposure to light, and development are sequentially carried out after forming a seed metal, whereby the resist is left only on the bottom surface of the through hole 62. Subsequently, the seed metal on the inorganic insulating layer 50 is subjected to wet etching. By doing so, it is possible to leave the Cu film only on the bottom surface of the through hole 62 in the case of using Cu/Ti as the seed metal. Thereafter, a metal film made, for example, of Cu, Ni, Pd, or a combination thereof may be formed by electroless plating.

Figure 4B:
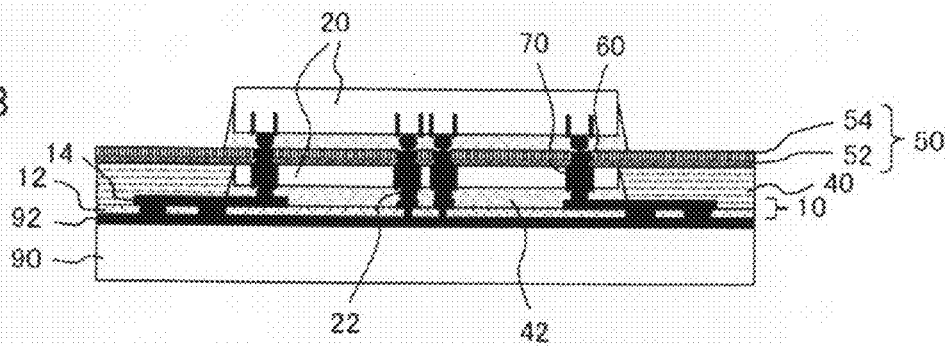

With respect to the semiconductor chips 20 of the second and subsequent layers, the above-described steps from mounting the chips to formation of the through electrode is repeated (FIG. 4B). FIG. 4B shows a state of the semiconductor chip 20 of the second layer immediately after filling with the underfill resin 42.

Figure 4C:
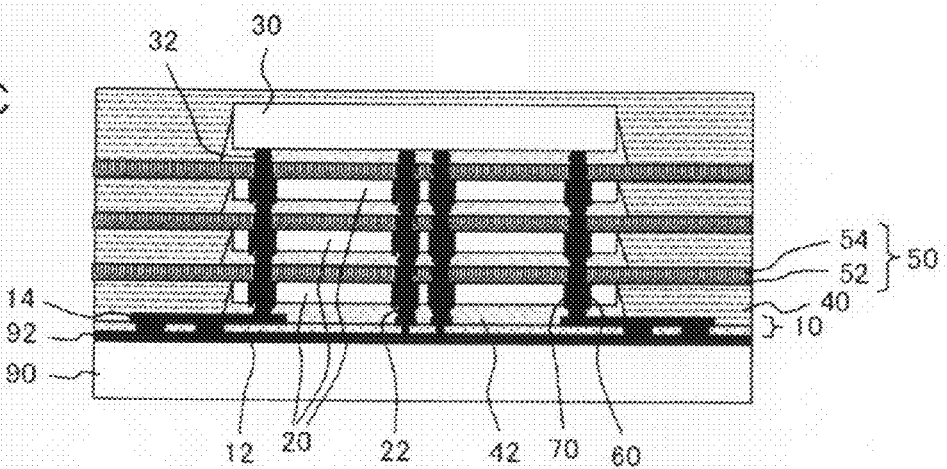

After mounting a predetermined number (three in the present example) of semiconductor chips 20 in this manner, a semiconductor chip 30 is mounted in a flip-chip manner on the inorganic insulating layer 50 that covers the back surface of the semiconductor chip 20 of the uppermost layer (FIG. 4C).

Next, the supporting substrate 90 is removed. This removal is carried out by grinding, CMP, etching, or the like. These may be carried out in combination, so that, after the supporting substrate 90 is ground, the residual parts may be removed by CMP or etching, or by using both. Regarding the etching, either of dry etching or wet etching may be used. However, when the step of the final removal is carried out by dry etching, the seed metal layer 92 can be left in a stable manner because the etching selection ratio can be made large.

Further, when a release layer is made to intervene between the supporting substrate 90 and the seed metal layer 92, the removal of the supporting substrate 90 is facilitated. For example, when a material that undergoes thermal decomposition is used as the release layer, the seed metal layer 92 can be separated from the supporting substrate 90 by heating to above the thermal decomposition temperature in the step of removing the supporting substrate 90. For this heating, a method of locally heating with use of laser or the like is preferable. By setting the wavelength of the laser so as to be a wavelength that transmits through the supporting substrate 90 and that does not transmit through the release layer, only the release layer can be locally heated.

Instead of this, a material may be selected in advance so that the adhesion strength of the interface between the supporting substrate 90 and the release layer or the interface between the release layer and the seed metal layer 92 is weak, and the supporting substrate 90 may be released by applying a mechanical force in the step of removing the supporting substrate 90. Also, a material that is dissolved into a specific solution or a material by which the close adhesion to the seed metal layer 92 or the supporting substrate 90 is extremely lowered by permeation of a solution may be selected as the release layer, whereby the supporting substrate 90 can be released by allowing the solution to permeate through the side surface of the release layer.

Thereafter, a solder bump 80 is formed on the bottom surface of the interconnect member, namely on the surface where the supporting substrate 90 has been disposed. This completes the multiple-chip type semiconductor device 1 (See FIG. 1).

Figure 5A:
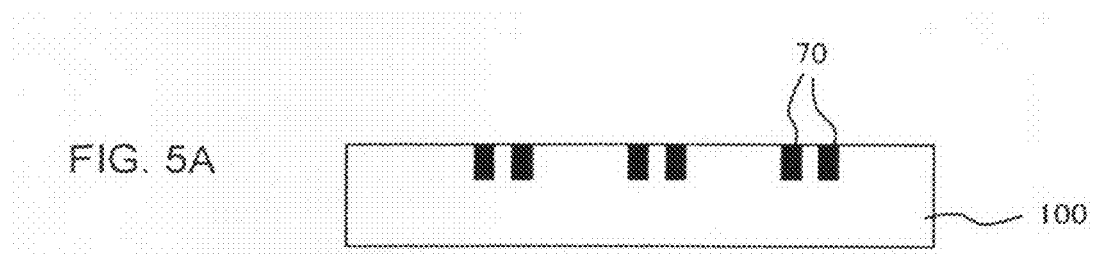
FIGS. 5A to 5C are views of steps showing an example of a step of forming the first semiconductor chip.
Figure 5B:
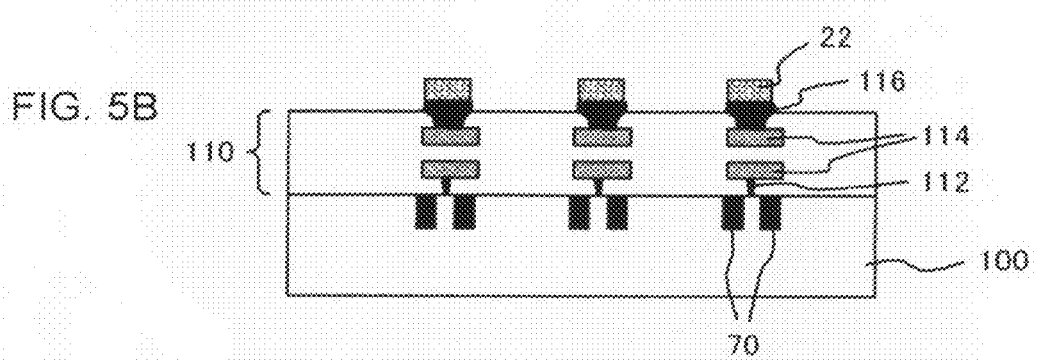
Figure 5C:
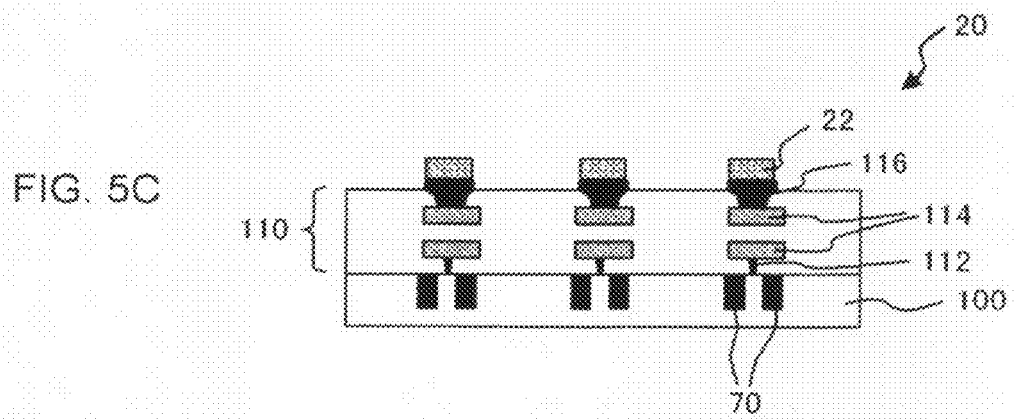

Here, with reference to FIGS. 5A to 5C, one example of a step of processing a device wafer (a wafer that includes the semiconductor chips 20 before being separated into individual pieces), namely a step of forming the semiconductor chips 20, will be described. First, an insulating ring 70 is formed in a semiconductor substrate 100 of a device wafer (FIG. 5A). This semiconductor substrate 100 will be a semiconductor substrate of semiconductor chips 20 after dicing. The insulating ring 70 is formed to surround a region where the through electrode 60 will be formed.

Next, an element isolation region such as STI and a semiconductor element such as a transistor (none are illustrated) are formed in the semiconductor substrate 100. Further, an interconnect layer 110 is formed on the semiconductor substrate 100. The interconnect layer 110 includes a contact plug 112 and an interconnect 114. The contact plug 112 is in contact with a region of the surface of the semiconductor substrate 100 that is surrounded by the insulating ring 70. By this, this contact plug 112 will be connected to the through electrode 60 in a later step. The interconnect 114 is disposed in a plurality of layers. The interconnects disposed in the same layer and the interconnects disposed in different layers are separated by an insulating layer. Thereafter, a solder bump (connection terminal 22) is formed on the interconnect layer 110 (FIG. 5B). This solder bump is connected to the interconnect 114 via a UBM (Under Bump Metal) 116.

Subsequently, the semiconductor substrate 100 is thinned by grinding or the like in accordance with the needs. Thereafter, this device wafer is separated into individual pieces to obtain semiconductor chips 20 (FIG. 5C). Here, in FIG. 1 and others described above, the interconnect layer of the semiconductor chips 20 is not illustrated.

Figure 6A:
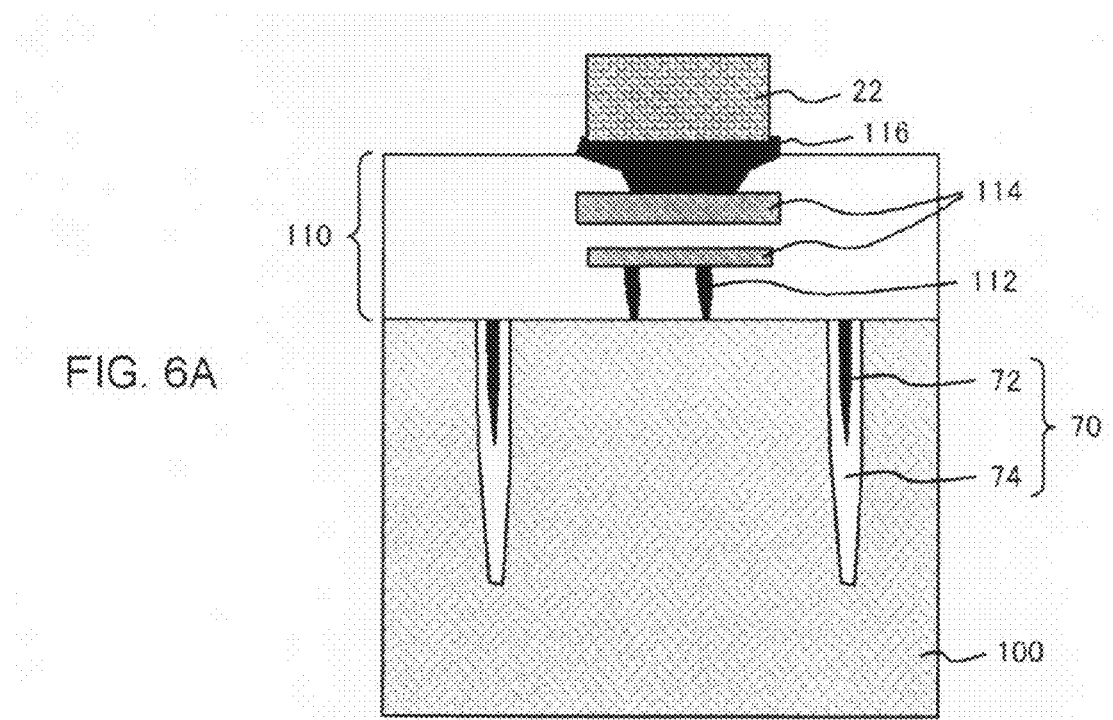
FIGS. 6A and 6B are views for explaining an example of a construction of an insulating ring.
Figure 6B:
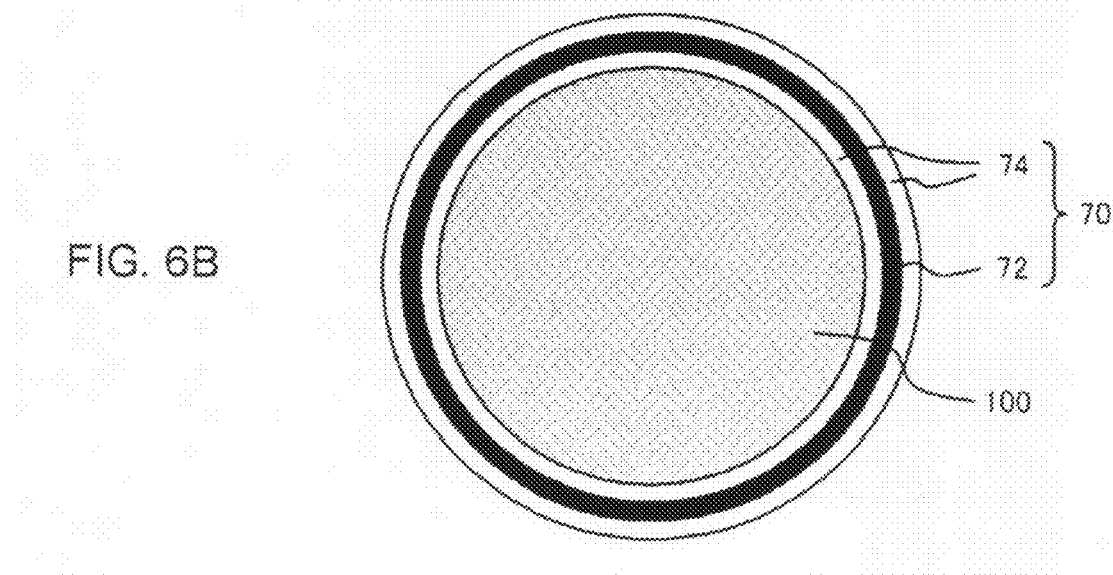

With reference to FIGS. 6A, 6B, 7A, and 7B, one example of a construction of the insulating ring 70 formed in the above-mentioned manner will be described. FIG. 6A is a cross-sectional view illustrating a part of the semiconductor chip 20. Also, FIG. 6B is a plan view illustrating the insulating ring 70 formed in the semiconductor chip 20. As shown in these drawings, the insulating ring 70 in this example is constructed with an electroconductive film 72 and an insulating film 74 disposed in the surroundings thereof. The insulating film 74 may be, for example, a laminate film of $SiO_2/SiN/SiO_2$. The insulating ring 70 may be constructed with the insulating film 74 alone. By addition of the electroconductive film 72, the filling of the insulating ring is facilitated.

A material of the electroconductive film 72 may be, for example, polysilicon, tungsten, or copper. In the case of forming a semiconductor element such as a transistor after forming the insulating ring 70, it is preferable to select polysilicon among these. By doing so, the thermal treatment in the step of forming the semiconductor element can be suitably carried out. Also, the electroconductive film 72 can be prevented from becoming a cause of metal contamination.

The insulating ring 70 having such a construction can be formed in the following manner. First, a trench is formed in the semiconductor substrate 100 by dry etching or the like. Subsequently, the trench is filled with the insulating film 74 and the electroconductive film 72. At this time, $SiO_2$ (thermally oxidized film), SiN, $SiO_2$, and the electroconductive film 72 are formed in this order. Thereafter, the electroconductive film 72 and the insulating film 74 remaining on the surface of the semiconductor substrate 100 are removed by CMP.

Figure 7A:
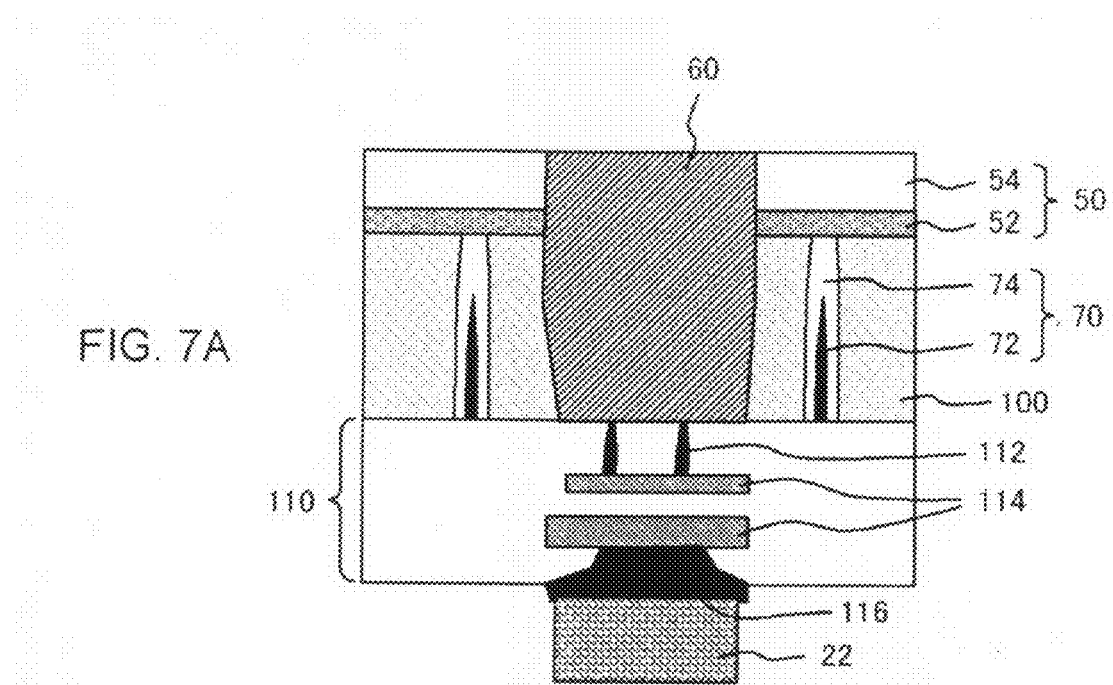
FIGS. 7A and 7B are views for explaining an example of a construction of an insulating ring.
Figure 7B:
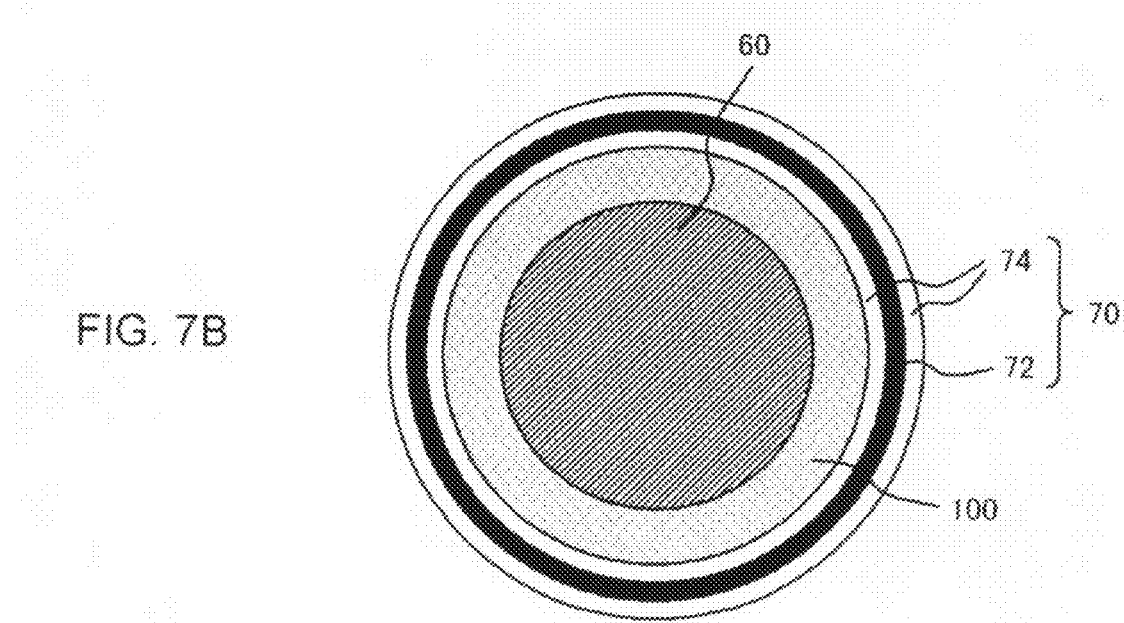

FIG. 7A is a cross-sectional view illustrating a part of the semiconductor chip 20 after the through electrode 60 is formed. Also, FIG. 7B is a plan view illustrating the insulating ring 70 after the through electrode 60 is formed. As shown in these drawings, the insulating ring 70 in the present example surrounds the through electrode 60 at a predetermined distance from the through electrode 60. Therefore, the semiconductor substrate 100 intervenes between the through electrode 60 and the insulating ring 70.

The effect of the present embodiment will be described. In the present embodiment, electrical connection between the semiconductor chip 20 and the semiconductor chip 30 is established by the through electrode 60. This reduces the path length of the signals transmitted between the two chips as compared with the case in which the electrical connection between these two chips is established by an interconnect that detours through the outside of the chips. For this reason, a semiconductor device 1 suitable for high-speed operation can be obtained.

Further, the inorganic insulating layer 50 is formed that directly covers the back surface of the semiconductor chip 20. This inorganic insulating layer 50 prevents the device region of the semiconductor chip 20 from being contaminated with metals. For this reason, the problem of metal contamination can be prevented from occurring even if the semiconductor chip is thinned, unlike the case in which the back surface of the semiconductor chip is stripped bare.

Also, the side surface of the semiconductor chip 20 is covered with the resin layer 40, and the back surface of the semiconductor chip 20 is covered with the inorganic insulating layer 50. With such a structure, a manufacturing technique of thinning the semiconductor chip 20 after mounting the semiconductor chip 20 on the interconnect member 10 can be suitably applied. Actually, in the manufacturing method according to the present embodiment, the semiconductor chip 20 is thinned after being mounted on the interconnect member 10. For this reason, there is no need to handle the thinned semiconductor chip 20 as a single piece. Therefore, the chip can be thinned to such a thickness that the handling as a single piece would be difficult. In other words, the chip can be thinned to a limit within a range that permits variation caused by grinding.

In view of these points, the manufacturing method according to the present embodiment is suitable for manufacturing a semiconductor device on which a thin type semiconductor chip is mounted. Also, the semiconductor device 1 is suitable for mounting a thin type semiconductor chip. Thus, in the present embodiment, the semiconductor device 1 suitable for high-speed operation and thickness reduction and a method of manufacturing the same are realized.

In the meantime, in the patent document 1, electrical connection between the semiconductor chips is established with use of an electrode post formed on the printed substrate without using a through electrode. In this case, the electrode post is also ground when the semiconductor chip is ground for thinning, thereby raising a problem of occurrence of contamination with the metal constituting the electrode post.

In view of this point, the present embodiment can avoid such a problem. In particular, by forming the through electrode 60 after thinning the semiconductor chip 20, the occurrence of contamination with the metal constituting the through electrode 60 is also prevented.

Also, in the patent document 4, the through electrode is formed in the device wafer. In the current semiconductor industry, processing of through electrodes is not general, so that a new production line is usually prepared for such processing. This raises a problem in that production equipment must be prepared for each size in order to meet a plurality of wafer sizes.

In view of this point, according to the present embodiment, the through electrode 60 is formed for the semiconductor chips 20 that have been separated into individual pieces, so that the formation of the through electrode 60 can be achieved with use of the same production equipment irrespective of the size of the device wafer.

Further, in the present embodiment, the process is completed for every semiconductor chip that is stacked. For this reason, a plurality of semiconductor chips having different sizes can be stacked.

Also, the inorganic insulating layer 50 is disposed so as to extend over the resin layer 40. This prevents the resin from swelling in a lithography process, in a plating process, or the like. For example, epoxy resin has a low resistance to chemical liquids such as acetone, isopropyl alcohol, ethyl acetate, butyl acetate, and methyl ethyl ketone, so that the epoxy resin may swell by absorbing these chemical liquids. When the resin swells in a neighborhood of the semiconductor chip 20, release is liable to occur therefrom.

The insulating ring 70 that surrounds the through electrode 60 is disposed in the semiconductor chip 20. This prevents the metal constituting the through electrode 60 from diffusing into the device region. Thus, the semiconductor device 1 is realized in which the problem of metal contamination is further less likely to occur. In addition, this insulating ring 70 functions also as an alignment mark in forming the through electrode 60. This facilitates position matching of the through electrode 60. Here, an alignment mark may be formed separately from the insulating ring 70.

Further, the insulating ring 70 improves the reliability of insulation between the semiconductor substrate 100 and the through electrode 60, and reduces the capacitance of the through electrode 60.

Particularly in the present embodiment, the insulating ring 70 surrounds the through electrode 60 at a predetermined interval therefrom. By designing the inner diameter of the insulating ring 70 to be larger than the diameter of the through electrode 60 in this manner, there will be an allowance in the position matching precision at the time of forming the through electrode 60. However, the insulating ring 70 may be disposed so as to be in contact with the through electrode 60.

The insulating ring 70 is made of the electroconductive film 72 and the insulating film 74 disposed in the surroundings thereof. By forming also the electroconductive film 72 in addition to the insulating film 74, filling of the trench will be facilitated at the time of forming the insulating ring 70. Also, formation of the insulating ring 70 itself is not essential. In particular, when the device is not sensitive to metal contamination or when the acceptable capacitance is large, there is no need to dispose the insulating ring 70. When the insulating ring 70 is not disposed, a step of forming a side wall insulating film will be essential after forming the through hole 62.

In the step of forming the interconnect member 10, the interconnect member 10 is formed on the supporting substrate 90, and the supporting substrate 90 is removed after the step of mounting the semiconductor chip 30. This allows that the step up to mounting the semiconductor chip 30 can be carried out on a wafer (that is supporting substrate 90). For this reason, an already existing production equipment can be effectively utilized.

The solder bump 80 is disposed on the bottom surface of the interconnect member 10. This allows that the semiconductor device 1 can be obtained as a BGA package. Also, this solder bump 80 is formed after removal of the supporting substrate 90. This allows that the solder bump 80 can be formed directly on the bottom surface of the interconnect member 10. For this reason, the generation of parasitic capacitance can be restrained, unlike the case in which the solder bump 80 is formed through the intermediary of a silicon substrate or the like.

In the step of filling the through hole 62 with a metal, the same process as in forming a Cu interconnect (damascene process) can be applied when a seed metal is formed by the sputtering method or the CVD method in the inside of the through hole 62 and on the inorganic insulating layer 50, and thereafter electrolytic plating is carried out, whereby the metal formed on the inorganic insulating layer 50 by the electrolytic plating is removed by CMP.

On the other hand, in the step of filling the through hole 62 with a metal, the through hole 62 can be filled without generating voids or the like when a seed metal is formed by the sputtering method in the inside of the through hole 62 and on the inorganic insulating layer 50, and thereafter the seed metal formed other than on the bottom surface of the through hole 62 is removed, followed by electroless plating. This is because the growth of plating occurs from the bottom surface of the through hole 62. Also, the process such as CMP for removing the metal can not be performed.

With reference to FIGS. 13A to 13C, FIGS. 14A to 14C and FIGS. 15A and 15B, another embodiment related to a semiconductor device and a method for manufacturing thereof according to the present invention will be described. In summary, the manufacturing method according to this embodiment includes the above-described steps (a) to (f).

Figure 13A:
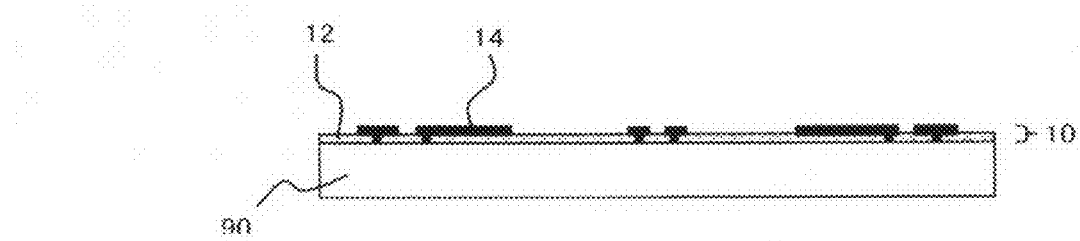
FIGS. 13A to 13C are views of steps showing another embodiment of a method of manufacturing a semiconductor device according to the present invention.

The manufacturing method will be fully described as follows. First of all, the interconnect 14 is formed on the supporting substrate 90 to obtain the interconnect member 10 (FIG. 13A). In this case, a silicon substrate, a glass substrate, a copper (Cu) substrate or the like may be employed for the supporting substrate 90. Further, in the present embodiment, a silicon wafer provided with semiconductor devices formed therein (i.e. device wafer) may also be employed. Since the supporting substrate 90 is to be remained as apart of a structure of the finished product of the semiconductor package in the present embodiment, a use of the device wafer as the supporting substrate 90 would reduce a number of assembly process operations per one piece of the semiconductor chip. Alternatively, it may be sufficient to form a pad electrode disposed in a location corresponding to a position of an electrode of the semiconductor chip 20 as the interconnect member 10.

Figure 13B:
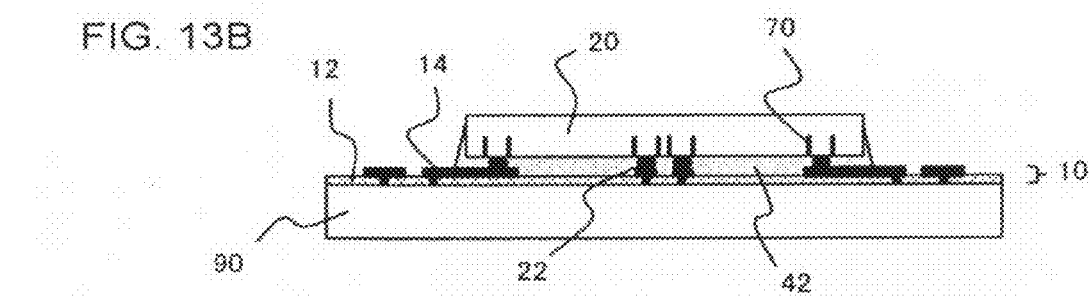
Figure 13C:
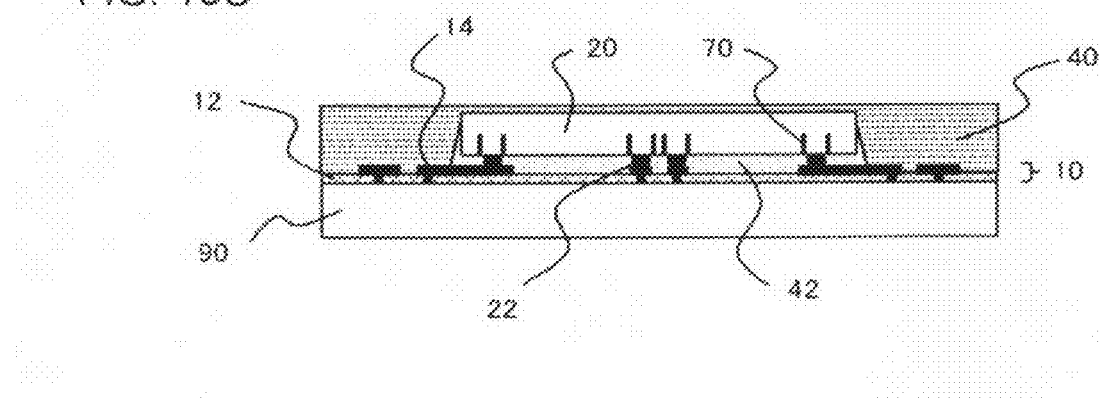

Next, on the interconnect member 10, a device chip (semiconductor chip 20) that has been separated into individual piece is mounted in a flip-chip manner. Further, the connection part of these, namely the gap between the interconnect member 10 and the semiconductor chips 20, is filled with the underfill resin 42 (FIG. 13B). At this time, a resin may be formed in advance by application, potting, or the like, and the resin may be cured simultaneously with the flip-chip connection. Subsequently, the resin layer 40 is formed on the interconnect member 10 so as to cover the side surface of the semiconductor chip 20 (FIG. 13C). At this time, the resin layer 40 may be formed so as to cover the back surface of the semiconductor chip 20, in addition to the side surface. Processes available for forming the resin layer 40 include coating, laminating, printing, molding or the like.

Figure 14A:
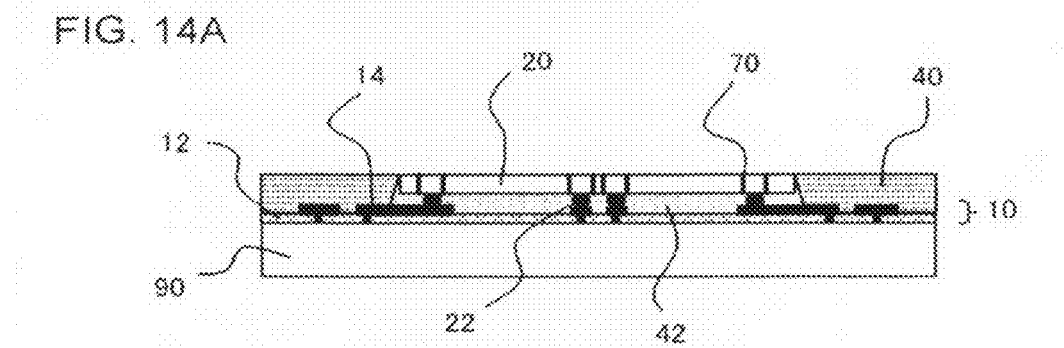
FIGS. 14A to 14C are views of steps showing another embodiment of a method of manufacturing a semiconductor device according to the present invention.

Thereafter, the semiconductor chip 20 and the resin layer 40 are simultaneously ground. By conducting such process operation, the semiconductor chip 20 and the resin layer 40 are thinned (FIG. 14A). At this time, the grinding is continued until the insulating ring 70 is exposed to the back surface of the semiconductor chip 20. The thickness of the semiconductor chip 20 after grinding may be, for example, about 20 µm to 30 µm. Here, in order to remove the scratch that has been created on the back surface of the semiconductor chip 20 in the grinding process, a stress relief process such as a polishing process, a chemical mechanical polishing (CMP) process or a dry etch process may additionally be carried out after conducting the grinding process. In addition, if the thickness of the semiconductor chip 20 is sufficiently reduced in the prior process, the same structure can be obtained by simply conducting the CMP process without conducting the grinding process.

Figure 14B:
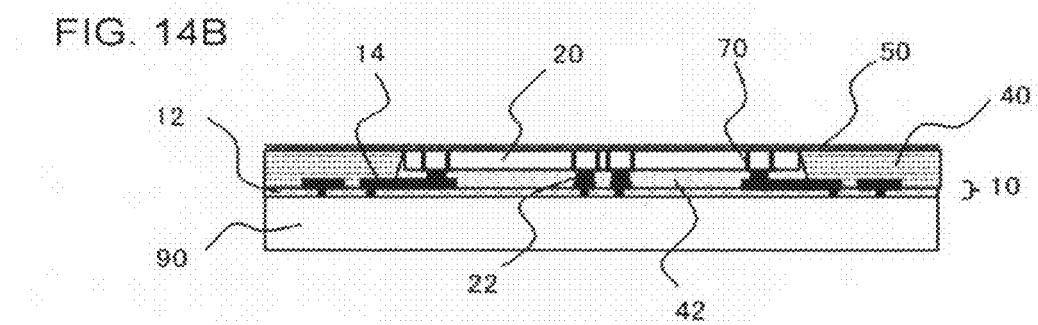
Figure 14C:
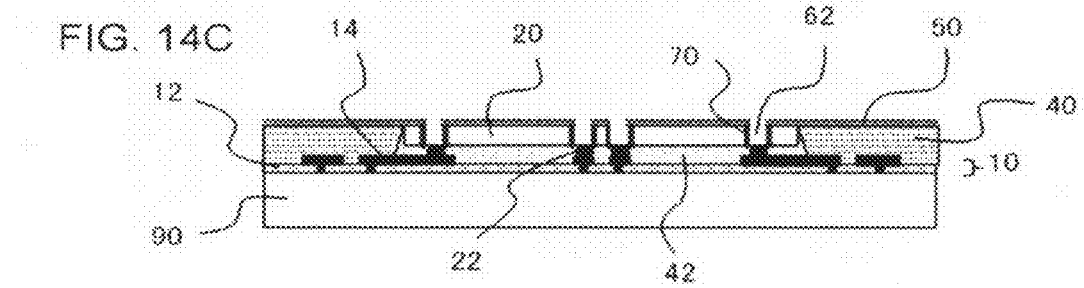

Then, a silicon nitride (SiN) film or a combination of a SiN film and a silicon oxide ($SiO_2$) film, serving as the inorganic insulating film 50, is formed on the back surface of the semiconductor chip 20 (FIG. 14B). Thereafter, an opening for forming the through electrode 60 is formed via a photolithography method or the like. Further, the through hole 62 extending through the inorganic insulating film 50 and the semiconductor substrate of the semiconductor chip 20 is formed via a dry etch process or the like (FIG. 14C). The above-described side wall insulating film may be formed on the side wall of the through hole 62.

Next, the through hole 62 is filled with a metal. This step may be carried out, for example, in the following manner. A seed metal is formed over the interior of the through hole 62 and the surface of the inorganic insulating layer 50 via a sputter process, and then, portions of the seed metal except the portion located on the bottom surface of the through hole 62 are removed, followed by carrying out electroless plating.

In the case of carrying out the filling of the through hole 62 with a metal itself by electroless plating, application of a resist, tilted exposure to light, and development are sequentially carried out after forming a seed metal, whereby the resist is left only on the bottom surface of the through hole 62. Subsequently, the seed metal on the inorganic insulating layer 50 is subjected to wet etching. By doing so, it is possible to leave the Cu film only on the bottom surface of the through hole 62 in the case of using Cu/Ti as the seed metal. Thereafter, a metal film made, for example, of Cu, Ni, Pd, or a combination thereof may be formed by electroless plating. Alternatively, the etch process may be continued until an interconnect interlayer film is etched during the process for forming the through hole 62, in addition to etching silicon of the silicon semiconductor chip, to expose the interconnect layer of the semiconductor chip, and thereafter, electroless plating may be conducted to fill the through hole. Typical interconnect material for the semiconductor chip may include aluminum (Al), copper (Cu), tungsten (W) or the like, an electroless plating may be carried out by employing any of the above-described interconnect materials. Typical materials utilized for the electroless plating process may include, Ni, Cu, gold (Au) or the like.

Figure 15A:
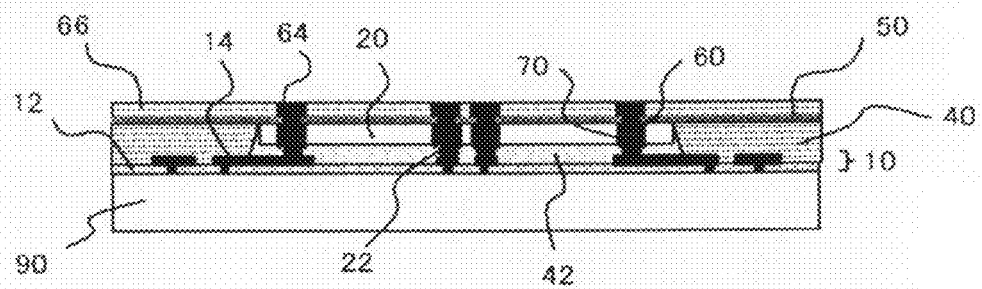
FIGS. 15A and 15B are views of steps showing another embodiment of a method of manufacturing a semiconductor device according to the present invention.

The above-described steps from mounting the chips to forming the through electrode may be repeated to obtain a multiple-layered structure, as required. As described above, a predetermined number (one in the present embodiment) of the semiconductor chip 20 is mounted, and thereafter, a Cu/Ti seed sputter is conducted for the back surface of the semiconductor chip 20 located in the uppermost layer, and then, a patterning process employed a resist, a Cu plating process, a resist stripping process and a seed etch process are sequentially conducted to form a copper (Cu) post 64. Further, a resin 66 is formed, and then a grinding process or a CMP process is conducted to expose a top surface of the Cu post 64 (FIG. 15A).

Figure 15B:
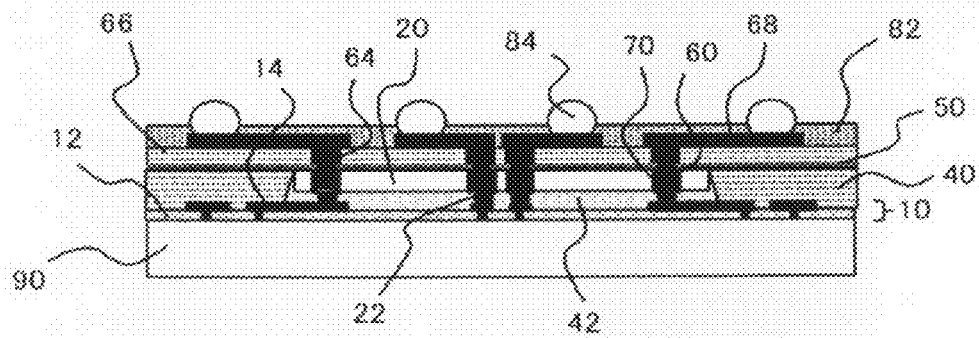

A Cu interconnect 68 connected to thus formed Cu post 64 is formed, and then a solder resist 82 is formed, the solder ball 84 is mounted and a dividing operation is conducted to eventually obtain a finished package (FIG. 15B). According to the present embodiment, a terminal (solder ball 84) may be exposed on the top surface of the package, thereby providing more simple process that requires smaller number of process operations. In addition, the combination of the solder ball 84 and the through electrode 60 provides a reduced length of the interconnect, and thus a speedup of operation of the device can be expected. Further, when a device wafer is employed for the supporting substrate 90, required number of the operations in an assembly process can be reduced. In addition, the Cu post 64 is formed on the back surface of the semiconductor chip 20 located in the uppermost layer to achieve the interconnect coupling with finer intervals. In an ordinary building-up process that involves forming a via hole by employing laser beam and filling the via hole with a metal, a lowest interval of vias is about 100 µm. On the contrary, in a process employing the Cu post, a coupling with an interval of vias of about 20 µm can be achieved.

Figure 16:
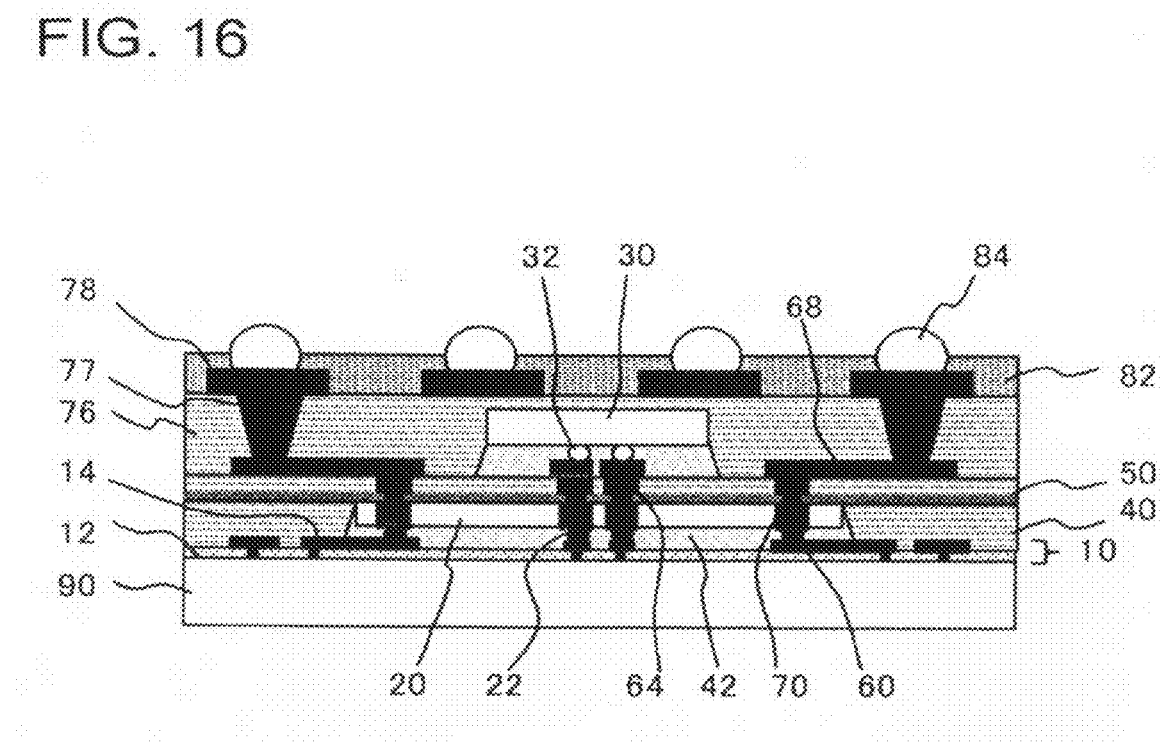
FIG. 16 is a cross-sectional view illustrating a modified example of a semiconductor device according to the embodiment.

In addition to above, in the present embodiment, an assembly of the device may be conducted by: after the Cu post 64 and the Cu interconnect 68 are formed, mounting semiconductor chip 30; forming a resin 76; forming a via 77 employing laser beam; forming a Cu interconnect 78; forming the solder resist 82; mounting the solder ball 84; and dividing thereof into respective chips (FIG. 16). Since the semiconductor chip 30 without through electrode can be included in the multiple-layered structure in such case, a reduced manufacturing cost can be achieved. In addition, a flexibility of conducting a rerouting in the uppermost surface, a position of the solder ball 84 can be freely determined.

Figure 17:
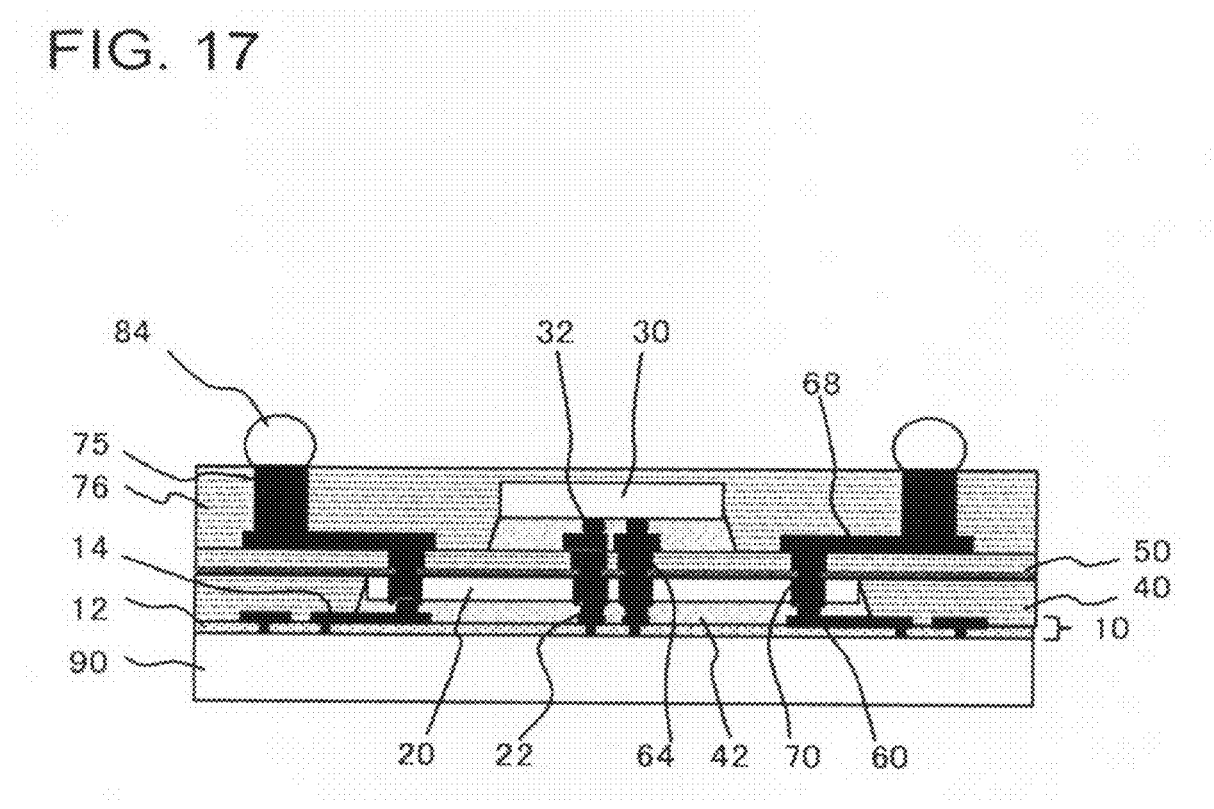
FIG. 17 is a cross-sectional view illustrating a modified example of a semiconductor device according to the embodiment.

In addition, an assembly of the device may be conducted by: after the Cu post 64 and the Cu interconnect 68 are formed, forming a Cu post 75; mounting semiconductor chip 30; forming the resin 76; grinding the surface of the resin; mounting the solder ball 84; and dividing thereof into respective chips (FIG. 17). In this case, forming the Cu post 75 can provide more simple process for forming the external terminal that requires smaller number of process operations. In addition, since an operation of a wafer-level chip scale packaging (CSP) can be utilized for forming the external terminal without any modification, existing facilities can be employed.

Figure 18:
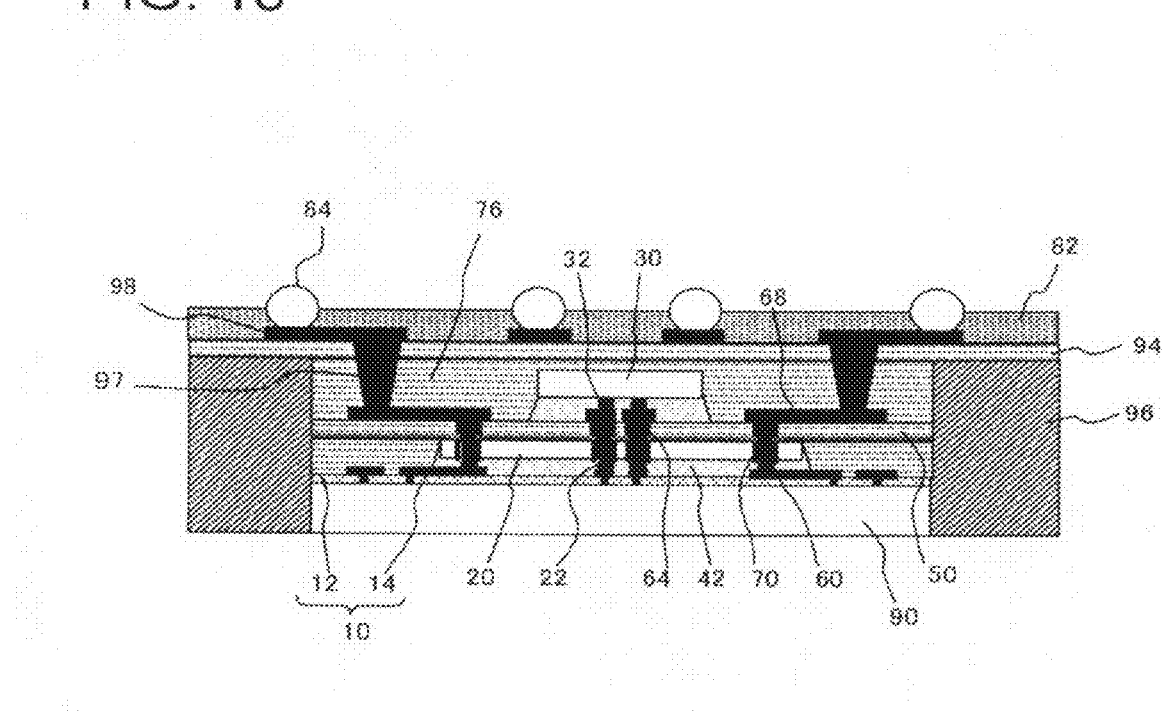
FIG. 18 is a cross-sectional view illustrating a modified example of a semiconductor device according to the embodiment.

In addition, an assembly of the device may be conducted by: after the Cu post 64 and the Cu interconnect 68 are formed, mounting semiconductor chip 30; forming the resin 76; dividing thereof into respective chips; mounting thereof to an adhesive layer 94; packaging thereof with a resin 96; forming a buildup layer (via 97 and Cu interconnect 98); forming the solder resist 82; mounting the solder ball 84; and dividing thereof into respective chips (FIG. 18). In such case, the external terminal may be fanned out to provide an availability of the device applied for larger package. A combination of a smaller package, which requires a process for forming a through electrode that is costly as the process requires forming a finer pattern, and a larger package, which is composed of only buildup interconnects that is less costly as the process requires forming more loose pattern, can achieve lower production cost for manufacturing the whole device.

With reference to FIGS. 19A to 19C and FIGS. 20A and 20B, another embodiment related to a semiconductor device and a method for manufacturing thereof according to the present invention will be described. In summary, the manufacturing method according to the present embodiment includes the following steps (g) to (i), in addition to the above-described steps (a) to (f):

(g) mounting a silicon interposer 130 on the inorganic insulating layer 50 so as to be electrically connected to the through electrode 60;

(h) forming an inorganic insulating film 134 on the silicon interposer 130; and (i) forming a through electrode 136 so as to penetrate the inorganic insulating film 134 and the silicon substrate of the silicon interposer 130.

Figure 19A:
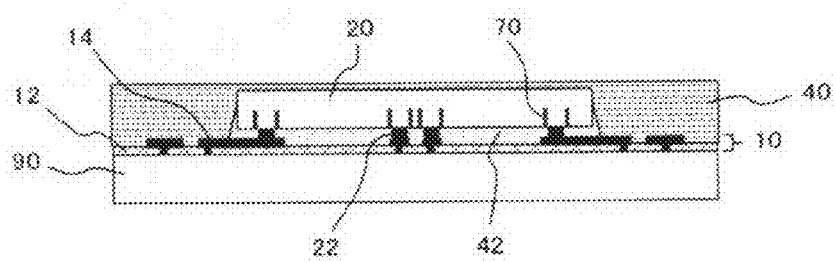
FIGS. 19A to 19C are views of steps showing another embodiment of a method of manufacturing a semiconductor device according to the present invention.

Hereafter, this manufacturing method will be described in more detail. First of all, the interconnect 14 is formed on the supporting substrate 90 and the interconnect member 10 is obtained. Next, on the interconnect member 10, a device chip (semiconductor chip 20) that has been separated into individual piece is mounted in a flip-chip manner. Further, the connection part of these, namely the gap between the interconnect member 10 and the semiconductor chips 20, is filled with the underfill resin 42. Subsequently, the resin layer 40 is formed on the interconnect member 10 so as to cover the side surface of the semiconductor chip 20 (FIG. 19A).

Thereafter, the semiconductor chip 20 and the resin layer 40 are simultaneously ground. By conducting such process operation, the semiconductor chip 20 and the resin layer 40 are thinned. At this time, the grinding is continued until the insulating ring 70 is exposed to the back surface of the semiconductor chip 20. Then, a SiN film or a combination of a SiN film and a $SiO_2$ film, serving as the inorganic insulating film 50, is formed on the back surface of the semiconductor chip 20. Thereafter, an opening for forming the through electrode 60 is formed via a photolithography method or the like. Further, the through hole 62 extending through the inorganic insulating film 50 and the semiconductor substrate of the semiconductor chip 20 is formed via a dry etch process or the like.

Figure 19B:
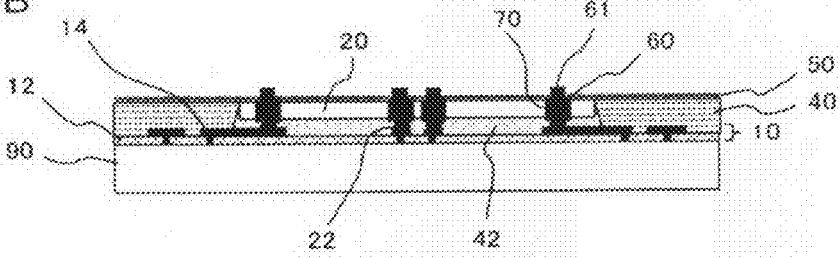

Next, the through hole 62 is filled with a metal. In the present embodiment, electroless plating process is utilized to fill thereof with a metal. At this occasion, an electrode pad 61 is formed simultaneously with forming the through electrode 60 by protruding a metal from the back surface of the semiconductor chip 20 (FIG. 19B). In this case, electroless Au plating finishing may be provided thereto, so that an oxidization of the electrode pad 61 can be prevented, thereby providing an improved electrical coupling in later processes for forming the contact or for coupling the chips.

The above-described steps from mounting the chips to forming the through electrode may be repeated to obtain a multiple-layered structure, as required. As described above, a predetermined number (one in the present embodiment) of the semiconductor chip 20 is mounted, and thereafter, a silicon interposer 130, which is free of active element mounted thereto, is mounted on the semiconductor chip 20 located in the uppermost layer. Here, the silicon interposer is a member obtained by forming only interconnects on a silicon substrate, or such member additionally including a passive element such as a capacitor element, a resistive element or the like incorporated therein. Then the gap between the inorganic insulating film 50 and the silicon interposer 130 is filled with the underfill resin 42. Subsequently, a resin layer 132 is formed on the inorganic insulating film 50 so as to cover the side surface of the silicon interposer 130. Thereafter, the silicon interposer 130 and the resin layer 132 are simultaneously ground. Such grinding process may be conducted in a way similar to that employed for simultaneously grinding the semiconductor chip 20 and the resin layer 40.

Figure 19C:
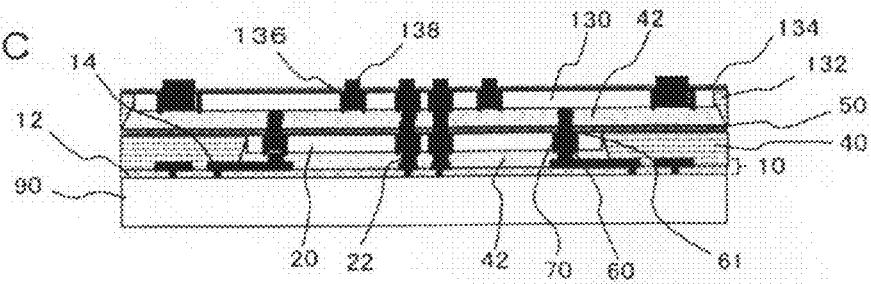

Then, a SiN film or a combination of a SiN film and a $SiO_2$ film, serving as the inorganic insulating film 134, is formed on the silicon interposer 130. The inorganic insulating film 134 is formed so as to be in contact with the silicon interposer 130 and to extend over the resin layer 134. Subsequently, a through electrode 136 and an electrode pad 138 are formed so as to extend through the inorganic insulating film 134 and the silicon substrate of the silicon interposer 130 (FIG. 19C). The through electrode 136 is electrically connected to the electrode pad 61 which is not located just under the through electrode 136 via an interconnect (not shown) formed on the bottom surface of the silicon interposer 130. The through electrode 136 and the electrode pad 138 may be formed in a way similar to that employed for forming the through electrode 60 and the electrode pad 61.

Figure 20A:
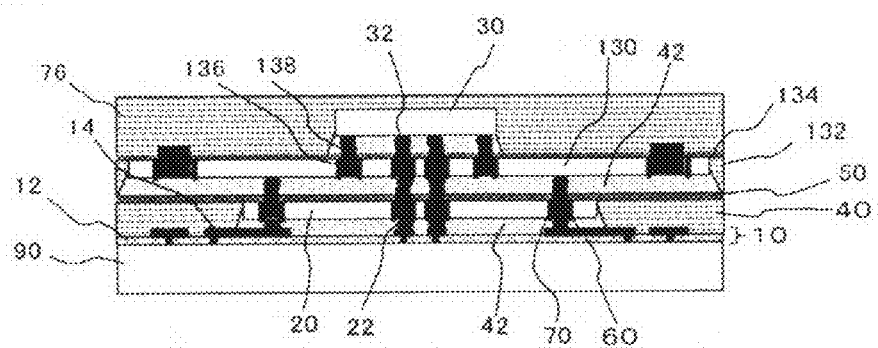
FIGS. 20A and 20B are views of steps showing another embodiment of a method of manufacturing a semiconductor device according to the present invention.
Figure 20B:
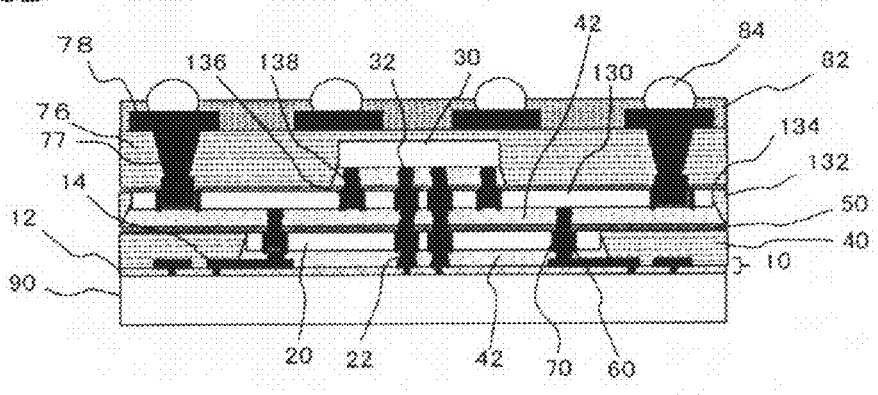

Then, the semiconductor chip 30 is mounted thereon, and a resin 76 is formed (FIG. 20A). Thereafter, an assembly of the device may be conducted by: forming a via 77 employing laser beam; forming a Cu interconnect 78; forming the solder resist 82; mounting the solder ball 84; and dividing thereof into respective chips (FIG. 20B). Since a fanning out is achieved by employing the silicon interposer 130 in the present embodiment, electrical couplings with much finer intervals of the interconnects can be applied to applications of larger dimensions. In addition, since microinterconnects formed by a silicon (Si) process can be employed in the case of requiring a rerouting between chips, and therefore performance of interconnect per one interconnect layer is considerably improved.

Figure 21:
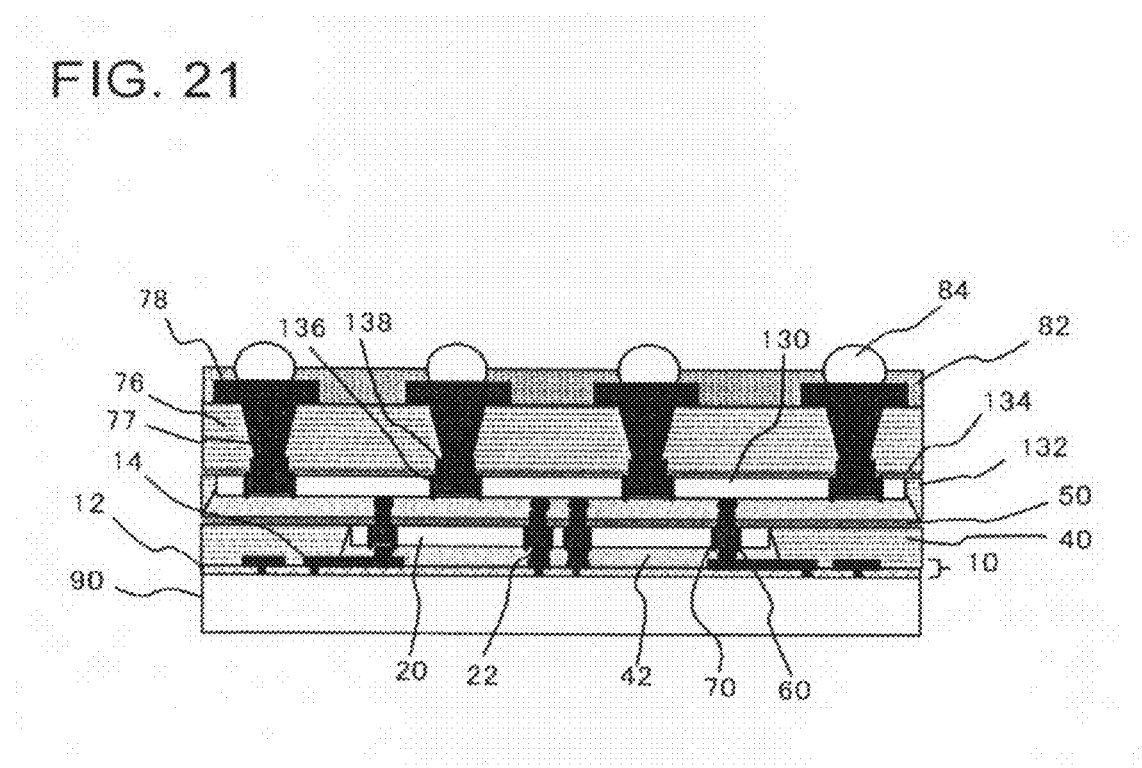
FIG. 21 is a cross-sectional view illustrating a modified example of a semiconductor device according to the embodiment.

In addition to above, in the present embodiment, an assembly of the device may be conducted by, after the through electrode 136 and the electrode pad 138 are formed, and without mounting the semiconductor chip 30; forming the resin 76; forming the via 77; forming the Cu interconnect 78; forming the solder resist 82; mounting the solder ball 84; and dividing thereof into respective chips (FIG. 21). In this case, the silicon interposer 130 is employed only for increasing the intervals. Having such configuration, the couplings in the through electrode 60, which has been otherwise narrower intervals and dense pin-arrangement, can vary easily be arranged with a level that is larger intervals between the solder balls 84. This is because the interconnect by the Si process can be employed.

Figure 22:
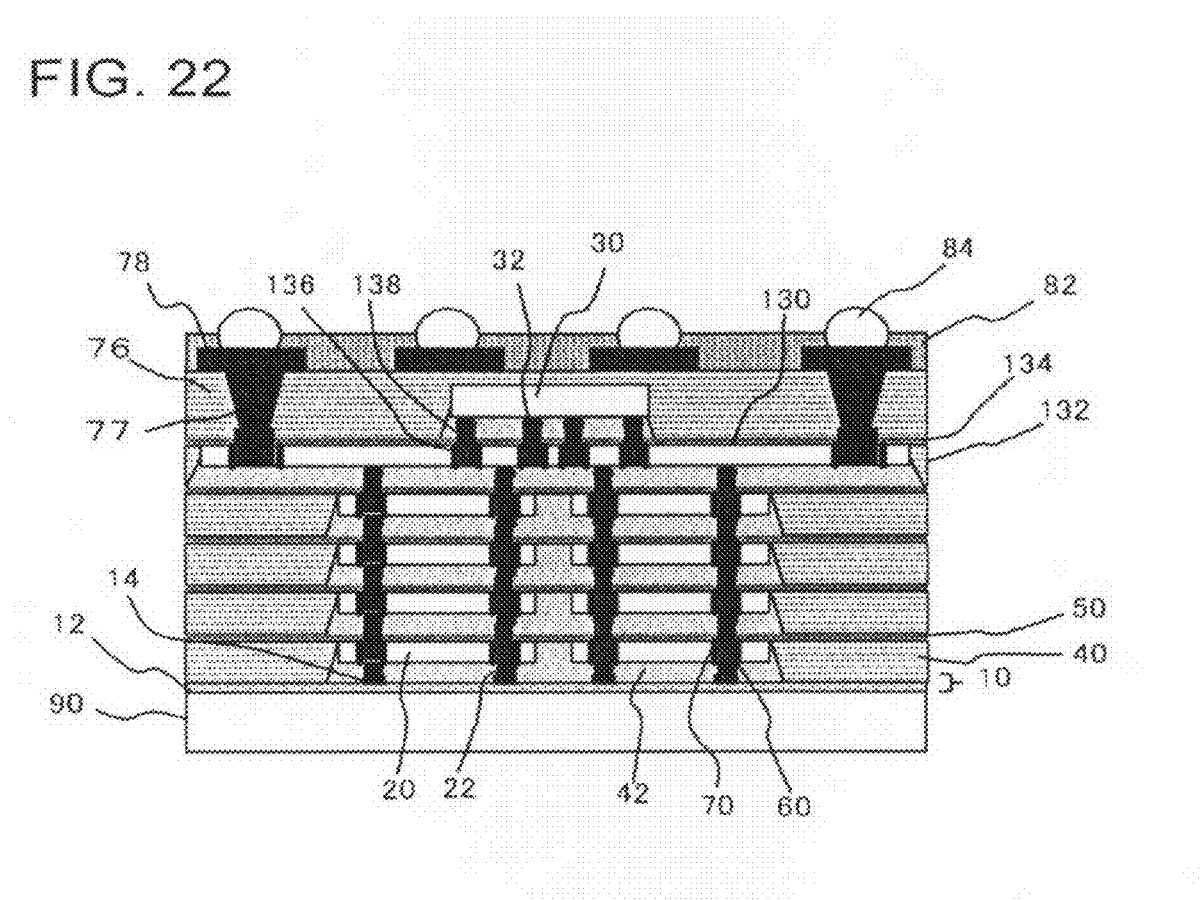
FIG. 22 is a cross-sectional view illustrating a modified example of a semiconductor device according to the embodiment.

In addition, the silicon interposer 130 may be mounted so as to collectively cover an upper portion of a plurality of the semiconductor chips 20 (FIG. 22). In such case, a considerable number of couplings of the multiple-layered chips can be collectively disposed in a chip of the uppermost layer. At the same time, the silicon interposer 130 also functions as being helpful for increasing the intervals of the chips to the intervals of the solder balls 84. Having such configuration, for example, a system-in-package (SiP), which is capable of providing faster accessibility with very large scale memory, can be achieved.

Figure 8:
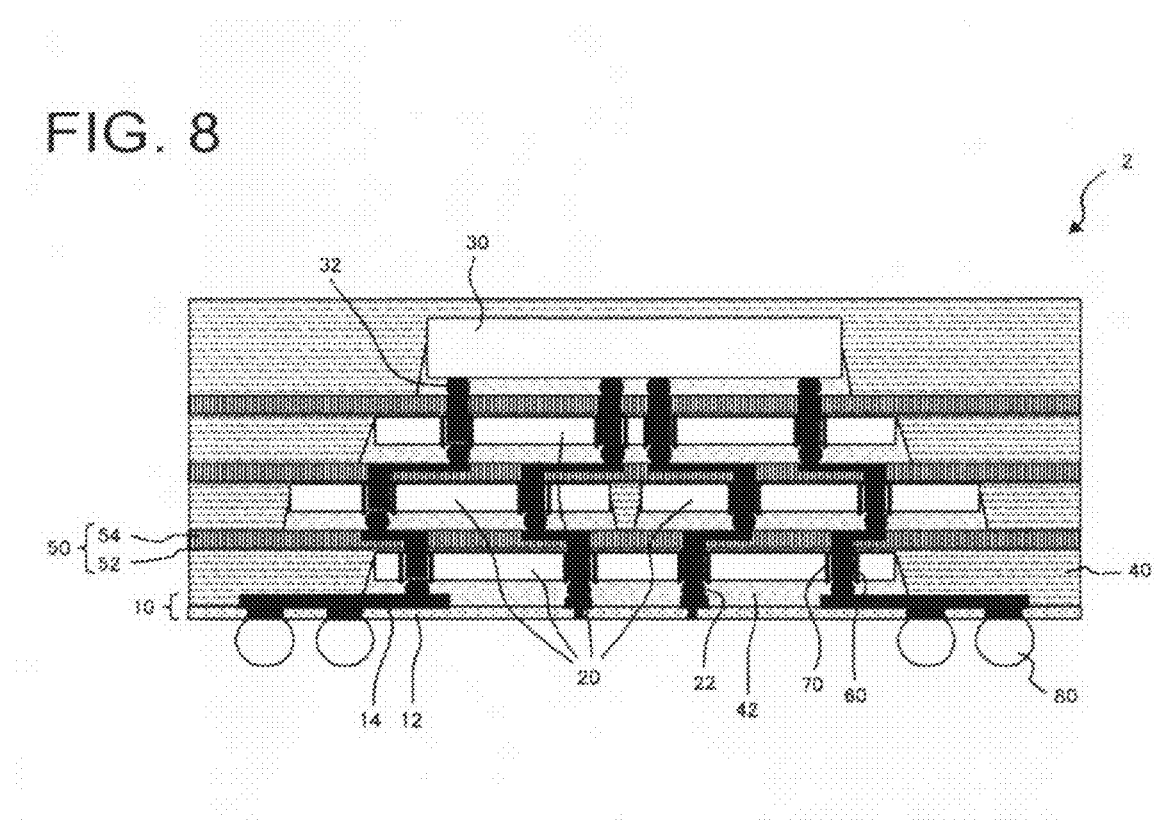
FIG. 8 is a cross-sectional view illustrating a modified example of a semiconductor device according to the embodiment.

The semiconductor device and the manufacturing method thereof according to the present invention are not limited to the above-described embodiments, so that various modifications can be made. For example, in the step of mounting the semiconductor chip 20 in a face-down manner, a plurality of semiconductor chips 20 may be mounted in the same layer. In the semiconductor device 2 shown in FIG. 8, a plurality (two in this example) of the semiconductor chips 20 are disposed in the second layer from the bottom. Similarly, in the step of mounting the semiconductor chip 30, a plurality of the semiconductor chips 30 may be disposed in the same layer. In that case, a semiconductor device is obtained in which a plurality of the semiconductor chips 30 are disposed in the same layer.

Figure 9A:
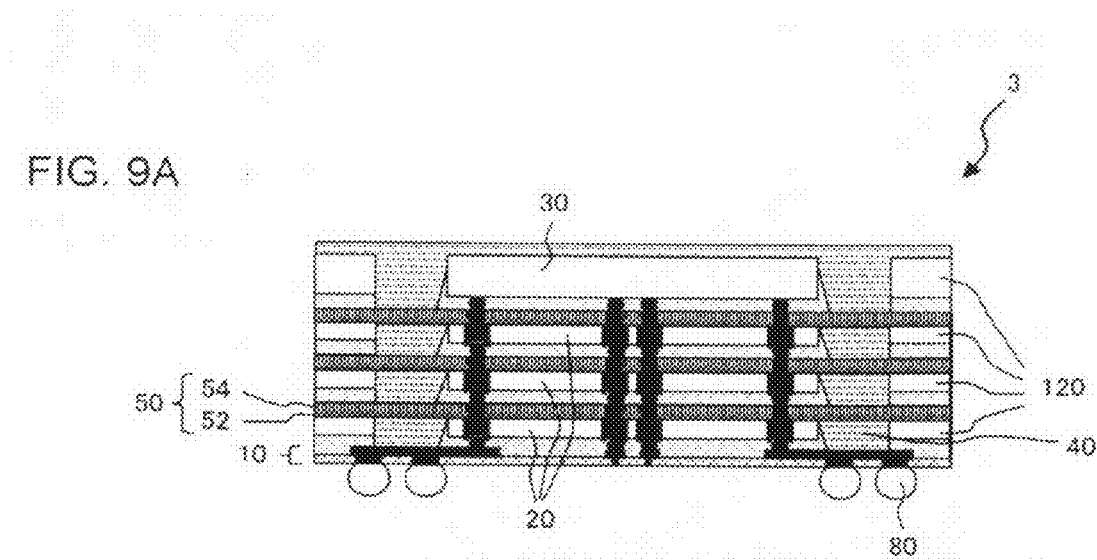
FIGS. 9A and 9B are views for explaining a modified example of a semiconductor device according to the embodiment.
Figure 9B:
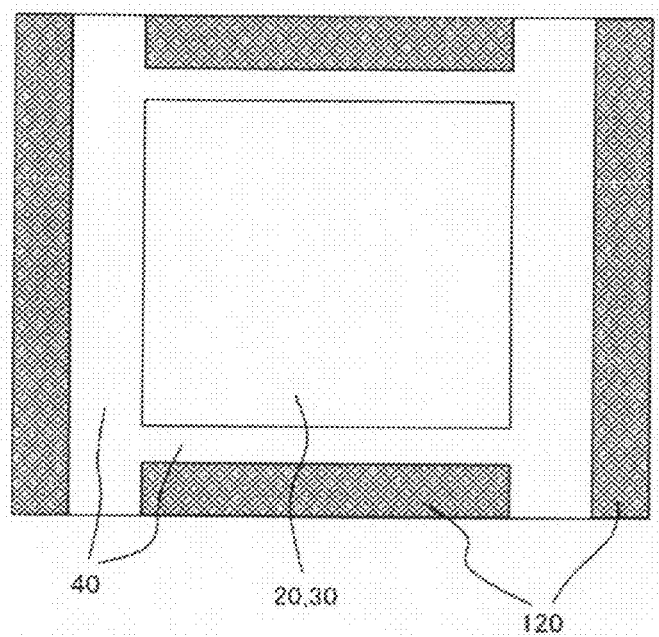

Also, the step of mounting the semiconductor chip 20 in a face-down manner may include a step of placing a dummy chip in the same layer as the semiconductor chip 20. The step of mounting the semiconductor chip 30 in a face-down manner may include a step of placing the dummy chip in the same layer as the semiconductor chip 30. Here, the dummy chip is a chip on which no semiconductor elements are formed. In the semiconductor device 3 shown in FIG. 9A, dummy chips 120 are disposed in both of the layer where the semiconductor chip 20 is disposed and the layer where the semiconductor chip 30 is disposed. FIG. 9B is a plan view illustrating a positional relationship between the semiconductor chip 20 (or semiconductor chip 30) and the dummy chip 120 in the semiconductor device 3. However, the dummy chip 120 may be disposed only in either one of the layer where the semiconductor chip 20 is disposed and the layer where the semiconductor chip 30 is disposed. Also, the dummy chip 120 may be disposed in a part of the layers among the plurality of layers where the semiconductor chip 20 is disposed. Also, a capacitance element may be disposed in the dummy chip 120, and the dummy chip 120 may be electrically connected to the semiconductor chip 20 or the semiconductor chip 30.

By placing the dummy chip in such a region where the chips are not disposed, the warping of the semiconductor device can be restrained to be small. This allows that a semiconductor device being excellent in mechanical strength is obtained. Further, the capacitance element may be formed in the dummy chip and may be connected by the interconnect layer, so as to be used as a decoupling capacitance. This allows that the fluctuation in the power source voltage can be restrained, whereby a device operation being capable of high-speed operation and being strong against the noise can be obtained.

Figure 10A:
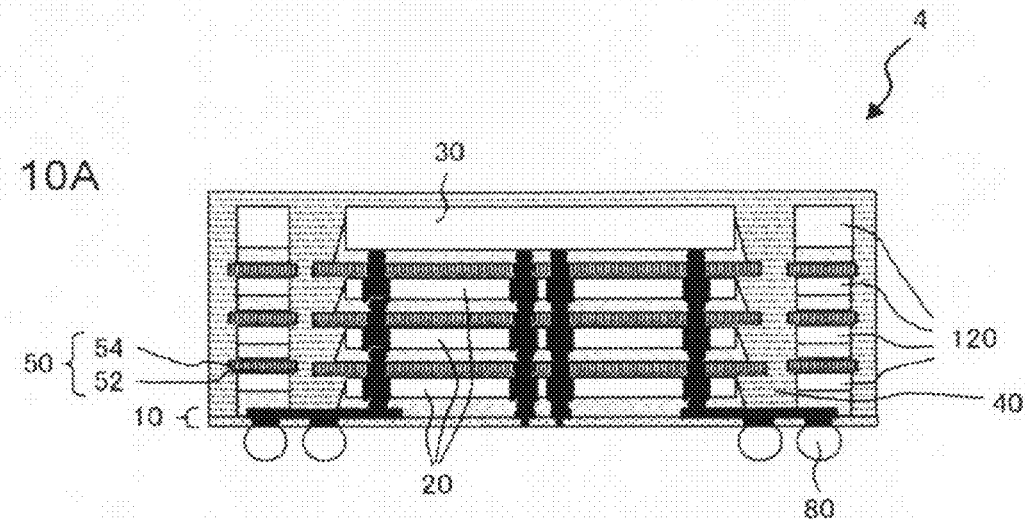
FIGS. 10A and 10B are views for explaining a modified example of a semiconductor device according to the embodiment.
Figure 10B:
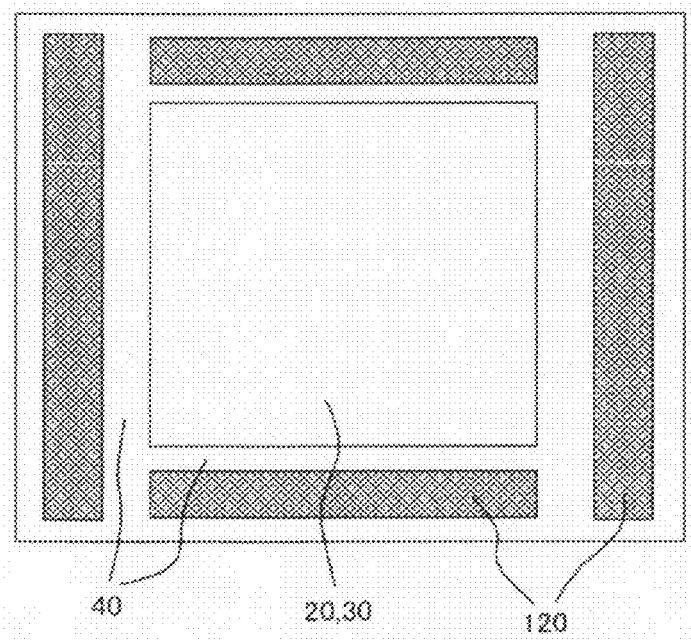

Further, in the step of placing the dummy chip, the dummy chip may be placed so as to be spaced apart from the side surface of the semiconductor device. In the semiconductor device 4 shown in FIG. 10A, the dummy chip 120 is spaced apart from the side surface of the semiconductor device 4. FIG. 10B is a plan view illustrating a positional relationship between the semiconductor chip 20 (or semiconductor chip 30) and the dummy chip 120 in the semiconductor device 4.

By adopting a structure in which the dummy chip does not overlap with the cut surface of the package in this manner, there will be no need to cut the dummy chip in the package dicing step. This allows that occurrence of the problem of cracks, stripping, and the like can be restrained.

Figure 11:
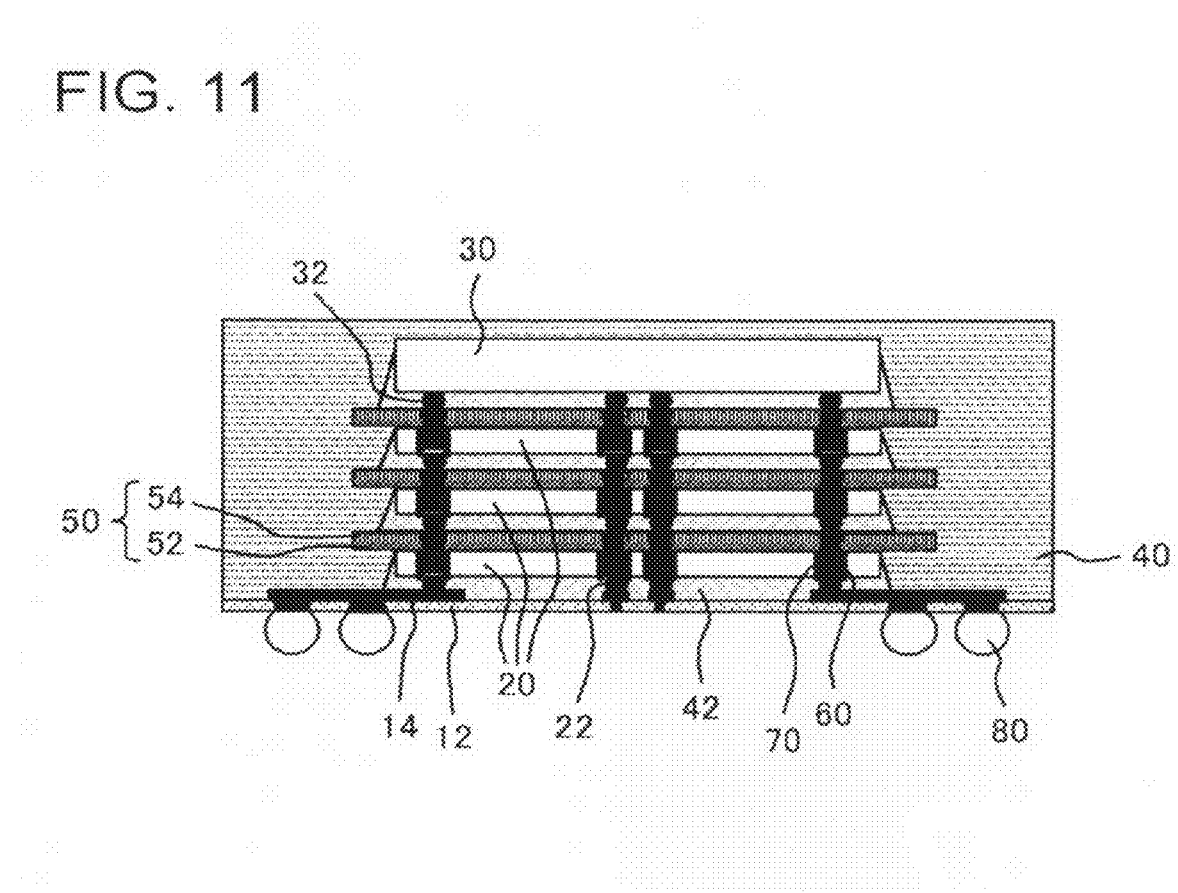
FIG. 11 is a cross-sectional view illustrating a modified example of a semiconductor device according to the embodiment.

In the above-described embodiments, an example has been shown in which the inorganic insulating layer 50 is disposed so as to extend over the entire surface of the resin layer 40. However, referring to FIG. 11, the inorganic insulating layer 50 may be disposed only on a part of the resin layer 40 so as to extend for a predetermined distance from the semiconductor chip 20. In this case, only the organic insulating layer is cut in the package dicing step, so that there will be no need to cut the inorganic insulating layer. This allows that occurrence of the problem of cracks, stripping, and the like can be restrained.

In the above-described embodiments, an example has been shown in which the sizes of the stacked chips are all equal; however, these chip sizes may be different from each other.

In the above-described embodiments, an example has been shown in which one insulating ring 70 is disposed for one through electrode 60. However, referring to FIG. 12, a plurality of the insulating rings 70 may be disposed for one through electrode 60. In FIG. 12, a plurality (two in the present example) of concentric insulating rings 70 surround one through electrode 60. FIG. 12 is a plan view similar to FIG. 7B.

It is apparent that the present invention is not limited to the above embodiment, and may be modified and changed without departing from the scope and spirit of the invention.

What is claimed is:

1. A method of manufacturing a semiconductor device, said method comprising:
    forming an interconnect member on a supporting substrate;
    mounting a first semiconductor chip having a semiconductor substrate in a face-down manner on said interconnect member;
    filling an opening between the interconnect member and the first semiconductor chip with an underfill resin, said underfill resin being disposed to cover a side surface of said first semiconductor chip;
    forming a resin layer on said interconnect member to cover the side surface of said first semiconductor chip via said underfill resin;
    thinning said first semiconductor chip and said resin layer;
    forming an inorganic insulating layer on a back surface of said first semiconductor chip so as to be in contact with said back surface and to extend over said resin layer;
    forming a through electrode so as to penetrate said inorganic insulating layer and said semiconductor substrate; and
    removing said supporting substrate after said forming of said through electrode,
    wherein said supporting substrate comprises a device wafer comprising a silicon substrate,
    wherein said removing said supporting substrate comprises removing an entirety of said supporting substrate to expose a lower surface of the interconnect member.

2. The method according to claim 1, further comprising mounting a second semiconductor chip in a face-down manner on said inorganic insulating layer so as to be electrically connected to said through electrode.

3. The method according to claim 2, wherein said mounting of said second semiconductor chip includes mounting a plurality of semiconductor chips as said second semiconductor chip in a same layer.

4. The method according to claim 2, wherein said mounting of said second semiconductor chip includes disposing a dummy chip, which comprises a chip where no semiconductor element is formed, in a same layer as said second semiconductor chip.

5. The method according to claim 1, further comprising:
    forming an insulating ring in said semiconductor substrate to surround a region where said through electrode is to be formed, before said mounting of said first semiconductor chip.

6. The method according to claim 1, wherein said mounting of said first semiconductor chip includes mounting a plurality of semiconductor chips as said first semiconductor chip in a same layer.

7. The method according to claim 1, wherein said mounting of said first semiconductor chip includes disposing a dummy chip, which comprises a chip where no semiconductor element is formed, in a same layer as said first semiconductor chip.

8. The method according to claim 4, wherein said dummy chip is disposed so as to be spaced apart from a side surface of said semiconductor device.

9. The method according to claim 1, further comprising:
    forming an external electrode terminal on a surface of said interconnect member where said supporting substrate has been disposed, after said removing of said supporting substrate.

10. The method according to claim 1, wherein said method further comprises forming an external electrode terminal on a surface of said first semiconductor chip after said forming of said through electrode.

11. The method according to claim 10, further comprising:
    mounting a second semiconductor chip in a face-down manner on said inorganic insulating layer so as to be electrically connected to said through electrode;
    forming a resin on said inorganic insulating film so as to cover said second semiconductor chip; and
    forming a via in said resin,
    wherein said forming of said external electrode terminal is conducted after said forming of said via, and
    wherein said external electrode terminal is electrically connected to said through electrode through said via.

12. The method according to claim 10, further comprising:
    forming a conductor post on said inorganic insulating film;
    mounting a second semiconductor chip in a face-down manner on said inorganic insulating layer so as to be electrically connected to said through electrode;
    forming a resin on said inorganic insulating film so as to cover said conductor post and said second semiconductor chip; and
    grinding said resin until said conductor post is exposed, wherein said forming of said external electrode terminal is conducted after said grinding of said resin, and
wherein said external electrode terminal is electrically connected to said through electrode through said conductor post.

13. The method according to claim 10, further comprising:
mounting a second semiconductor chip in a face-down manner on said inorganic insulating layer so as to be electrically connected to said through electrode;
forming a resin on said inorganic insulating film so as to cover said second semiconductor chip;
adhering an adhesive layer on said resin, said adhesive layer having a larger area than an area of said resin; and
forming a via in said adhesive layer and said resin,
wherein said forming of said external electrode terminal is conducted after said forming of said via, and
wherein said external electrode terminal is electrically connected to said through electrode through said via.

14. The method according to claim 10, further comprising:
mounting a silicon interposer having a silicon substrate on an inorganic insulating film so as to be electrically connected to said through electrode;
forming a second inorganic insulating film on said silicon interposer; and
forming a second through electrode so as to penetrate said second inorganic insulating layer and said silicon substrate,
wherein said forming of said external electrode terminal is conducted after said forming of said second through electrode, and
wherein said external electrode terminal is electrically connected to said through electrode of said first semiconductor chip through said second through electrode.

15. The method according to claim 14, further comprising:
mounting a second semiconductor chip in a face-down manner on said second inorganic insulating layer so as to be electrically connected to said second through electrode;
forming a resin on said second inorganic insulating film so as to cover said second semiconductor chip; and
forming a via in said resin,
wherein said forming of said external electrode terminal is conducted after said forming of said via, and
wherein said external electrode terminal is electrically connected to said through electrode of said first semiconductor chip through said second through electrode and said via.

16. The method according to claim 14, further comprising:
forming a resin on said second inorganic insulating film without mounting a semiconductor chip; and
forming a via in said resin,
wherein said forming of said external electrode terminal is conducted after said forming of said via, and
wherein said external electrode terminal is electrically connected to said through electrode of said first semiconductor chip through said second through electrode and said via.

17. The method according to claim 14, wherein said silicon interposer is mounted to collectively cover an upper portion of a plurality of said first semiconductor chips.

18. The method according to claim 1, wherein said forming of said through electrode includes forming a through hole that penetrates said inorganic insulating layer and said semiconductor substrate, and filling said through hole with a metal, and
wherein in said filling of said through hole, a seed metal is formed in an inside of said through hole and on said inorganic insulating layer by a sputtering method or a chemical vapor deposition (CVD) method, and thereafter, electrolytic plating is carried out, and a metal formed on said inorganic insulating layer by said electrolytic plating is removed by chemical-mechanical polishing (CMP).

19. The method according to claim 1, wherein said forming of said through electrode includes forming a through hole that penetrates said inorganic insulating layer and said semiconductor substrate, and filling said through hole with a metal, and
wherein in said filling of said through hole, a seed metal is formed in an inside of said through hole and on said inorganic insulating layer by a sputtering method, and said seed metal formed on places other than a bottom surface of said through hole is removed, and thereafter, electroless plating is carried out.

20. The method according to claim 1, wherein the underfill resin is disposed on an upper surface of the first semiconductor chip.

21. The method according to claim 20, wherein the underfill resin is further disposed between said side surface of the first semiconductor chip and a side surface of said resin layer.

22. The method according to claim 1, wherein said forming the inorganic insulating layer comprises forming a $SiO_2$ film on a SiN film.

23. The method according to claim 1, further comprising forming an insulating ring in said semiconductor substrate to surround said through electrode within the first semiconductor chip.

24. The method according to claim 1, wherein an upper surface of said resin layer is co-planar with the back surface of the first semiconductor chip such that said inorganic insulating layer extends over said first semiconductor chip and said resin layer in a continues straight line.

25. The method according to claim 1, wherein said forming the interconnect member comprises:
disposing a seed metal layer on said supporting substrate; and
electrolytic plating the seed metal layer to form the interconnect member.

* * * * *